United States Patent
Chen et al.

(10) Patent No.: US 8,415,884 B2
(45) Date of Patent: Apr. 9, 2013

(54) STABLE SURFACE WAVE PLASMA SOURCE

(75) Inventors: Lee Chen, Cedar Creek, TX (US);
Jianping Zhao, Houston, TX (US);
Ronald V. Bravenec, Austin, TX (US);
Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 847 days.

(21) Appl. No.: 12/555,080

(22) Filed: Sep. 8, 2009

(65) Prior Publication Data
US 2011/0057562 A1 Mar. 10, 2011

(51) Int. Cl.
*H05B 31/26* (2006.01)
(52) U.S. Cl.
USPC ............. 315/111.01; 315/111.21; 315/111.51
(58) Field of Classification Search ........... 315/111.01–111.91; 118/723 MW; 156/345.36, 345.41
See application file for complete search history.

(56) References Cited

U.S. PATENT DOCUMENTS

| | | | |
|---|---|---|---|
| 5,234,526 A * | 8/1993 | Chen et al. | 156/345.42 |
| 6,026,762 A * | 2/2000 | Kao et al. | 118/723 ME |
| 6,124,833 A | 9/2000 | Bialkowski et al. | |
| 7,218,184 B2 | 5/2007 | Yamanaka et al. | |
| 2004/0095074 A1 * | 5/2004 | Ishii et al. | 315/111.21 |
| 2005/0005854 A1 | 1/2005 | Suzuki | |
| 2005/0257891 A1 * | 11/2005 | Goto et al. | 156/345.41 |
| 2006/0071607 A1 * | 4/2006 | Chen et al. | 315/111.01 |

OTHER PUBLICATIONS

International Searching Authority, International Search Report and Written Opinion, International Application No. PCT/US2010/047092, Mailed Oct. 21, 2010, 10 pages.

* cited by examiner

*Primary Examiner* — Tung X Le
(74) *Attorney, Agent, or Firm* — Wood, Herron & Evans, LLP

(57) ABSTRACT

A surface wave plasma (SWP) source is described. The SWP source comprises an electromagnetic (EM) wave launcher configured to couple EM energy in a desired EM wave mode to a plasma by generating a surface wave on a plasma surface of the EM wave launcher adjacent the plasma. The EM wave launcher comprises a slot antenna having a plurality of slots. The SWP source further comprises a first recess configuration formed in the plasma surface, wherein the first recess configuration is substantially aligned with a first arrangement of slots in the plurality of slots, and a second recess configuration formed in the plasma surface, wherein the second recess configuration is either partly aligned with a second arrangement of slots in the plurality of slots or not aligned with the second arrangement of slots in the plurality of slots. A power coupling system is coupled to the EM wave launcher and configured to provide the EM energy to the EM wave launcher for forming the plasma.

20 Claims, 18 Drawing Sheets

STABLE SURFACE WAVE PLASMA SOURCE

BACKGROUND OF THE INVENTION

1. Field of the Invention

The invention relates to a surface wave plasma (SWP) source and, more particularly, to a stable and/or uniform SWP source.

2. Description of Relate Art

Typically, during semiconductor processing, a (dry) plasma etch process is utilized to remove or etch material along fine lines or within vias or contacts patterned on a semiconductor substrate. The plasma etch process generally involves positioning a semiconductor substrate with an overlying patterned, protective layer, for example a photoresist layer, into a processing chamber.

Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a portion of the gas species present are ionized following a collision with an energetic electron. Moreover, the heated electrons serve to dissociate some species of the mixture gas species and create reactant specie(s) suitable for the exposed surface etch chemistry. Once the plasma is formed, any exposed surfaces of the substrate are etched by the plasma. The process is adjusted to achieve optimal conditions, including an appropriate concentration of desirable reactant and ion populations to etch various features (e.g., trenches, vias, contacts, etc.) in the exposed regions of substrate. Such substrate materials where etching is required include silicon dioxide ($SiO_2$), poly-silicon and silicon nitride, for example.

Conventionally, various techniques have been implemented for exciting a gas into plasma for the treatment of a substrate during semiconductor device fabrication, as described above. In particular, ("parallel plate") capacitively coupled plasma (CCP) processing systems, or inductively coupled plasma (ICP) processing systems have been utilized commonly for plasma excitation. Among other types of plasma sources, there are microwave plasma sources (including those utilizing electron-cyclotron resonance (ECR)), surface wave plasma (SWP) sources, and helicon plasma sources.

It is becoming common wisdom that SWP sources offer improved plasma processing performance, particularly for etching processes, over CCP systems, ICP systems and resonantly heated systems. SWP sources produce a high degree of ionization at a relatively lower Boltzmann electron temperature ($T_e$). In addition, SWP sources generally produce plasma richer in electronically excited molecular species with reduced molecular dissociation. However, the practical implementation of SWP sources still suffers from several deficiencies including, for example, plasma stability and uniformity.

SUMMARY OF THE INVENTION

The invention relates to a surface wave plasma (SWP) source and, more particularly, to a stable and/or uniform SWP source.

According to an embodiment, a surface wave plasma (SWP) source is described. The SWP source comprises an electromagnetic (EM) wave launcher configured to couple EM energy in a desired EM wave mode to a plasma by generating a surface wave on a plasma surface of the EM wave launcher adjacent the plasma. The EM wave launcher comprises a slot antenna having a plurality of slots. The plurality of slots is configured to couple the EM energy from a first region above the slot antenna to a second region below the slot antenna. A resonator plate is positioned in the second region and has a lower surface that includes the plasma surface of the EM wave launcher. The SWP source further comprises a first recess configuration formed in the plasma surface, wherein the first recess configuration is substantially aligned with a first arrangement of slots in the plurality of slots, and a second recess configuration formed in the plasma surface, wherein the second recess configuration is either partly aligned with a second arrangement of slots in the plurality of slots or not aligned with the second arrangement of slots in the plurality of slots. A power coupling system is coupled to the EM wave launcher and configured to provide the EM energy to the EM wave launcher for forming the plasma.

According to another embodiment, a surface wave plasma (SWP) source is described. The SWP source comprises an electromagnetic (EM) wave launcher configured to couple EM energy in a desired EM wave mode to a plasma by generating a surface wave on a plasma surface of the EM wave launcher adjacent said plasma. The EM wave launcher comprises a slot antenna having a plurality of slots formed therethrough configured to couple the EM energy from a first region above the slot antenna to a second region below the slot antenna, and a resonator plate positioned in the second region and having a lower surface including the plasma surface of the EM wave launcher. A first recess configuration is formed in the plasma surface, wherein the first recess configuration is substantially aligned with a first arrangement of slots in the plurality of slots. Additionally, means for stabilizing the plasma for a pressure in the process space ranging from about 10 mtorr to about 1 torr is provided, wherein the means for stabilizing the plasma is formed in the plasma surface of the resonator plate, and means for uniformly generating said plasma in said process space is provided. Furthermore, the SWP source comprises a power coupling system coupled to the EM wave launcher and configured to provide the EM energy to the EM wave launcher for forming the plasma.

According to yet another embodiment, a surface wave plasma (SWP) source is described. The SWP source comprises an electromagnetic (EM) wave launcher configured to couple EM energy in a desired EM wave mode to a plasma by generating a surface wave on a plasma surface of the EM wave launcher adjacent the plasma, wherein the EM wave launcher comprises a slot antenna having a substantially circular geometry and having a plurality of slots formed therethrough configured to couple the EM energy from a first region above the slot antenna to a second region below the slot antenna, and wherein the plurality of slots comprises a first plurality of slots located at a substantially peripheral region of the slot antenna and a second plurality of slots located at a substantially central and/or mid-radius region of the slot antenna. Additionally, the SWP source comprises a resonator plate positioned in the second region and having a lower surface of the resonator plate including the plasma surface of the EM wave launcher. A first recess configuration is formed in the plasma surface, wherein the first recess configuration is substantially aligned with the first plurality of slots, and a second recess configuration is formed in the plasma surface, wherein the second recess configuration is fully aligned with the second plurality of slots, partly aligned with the second plurality of slots, or not aligned with the second plurality of slots. Furthermore, the SWP source comprises a power coupling system coupled to the EM wave launcher and configured to provide the EM energy to the EM wave launcher for forming the plasma.

DETAILED DESCRIPTION OF EXEMPLARY EMBODIMENTS

A SWP source is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

Figure 1A:
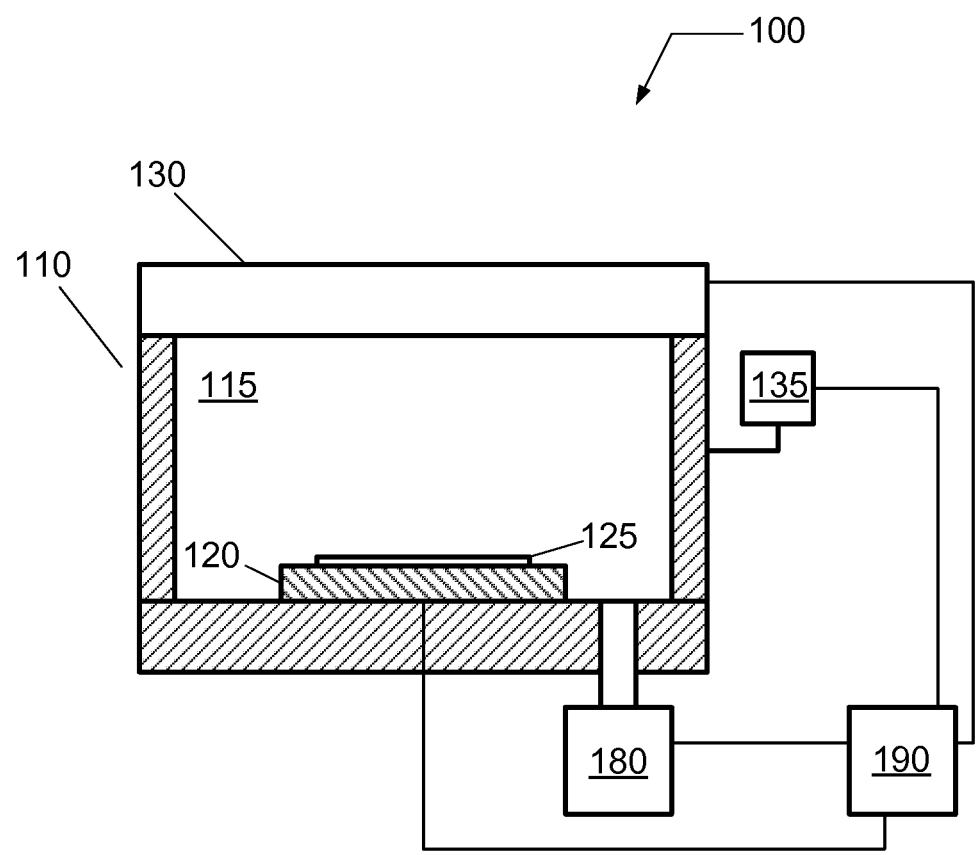
FIG. 1A presents a simplified schematic representation of a plasma processing system according to an embodiment.

Referring now to the drawings, wherein like reference numerals designate identical or corresponding parts throughout the several views, FIG. 1A illustrates a plasma processing system 100 according to an embodiment. The plasma processing system 100 may comprise a dry plasma etching system or a plasma enhanced deposition system.

The plasma processing system 100 comprises a processing chamber 110 configured to define a process space 115. The processing chamber 110 comprises a substrate holder 120 configured to support a substrate 125. Therein, the substrate 125 is exposed to plasma or process chemistry in process space 115. Furthermore, the plasma processing system 100 comprises a plasma source 130 coupled to the processing chamber 110, and configured to form plasma in the process space 115. The plasma source 130 comprises a surface wave plasma (SWP) source, such as a radial line slot antenna (RLSA), to be discussed below.

As seen in FIG. 1A, the plasma processing system 100 comprises a gas supply system 135 coupled to the processing chamber 110 and configured to introduce a process gas to process space 115. During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or SF6 or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma enhanced deposition, the process gas may comprise a film forming precursor, a reduction gas, or an inert gas, or a combination of two or more thereof.

Furthermore, the plasma processing system 100 includes a pumping system 180 coupled to the processing chamber 110, and configured to evacuate the processing chamber 110, as well as control the pressure within the processing chamber 110. Optionally, the plasma processing system 100 further includes a control system 190 coupled to the processing chamber 110, the substrate holder 120, the plasma source 130, the gas supply system 135, and the pumping system 180. The control system 190 can be configured to execute a process recipe for performing at least one of an etch process and a deposition process in the plasma processing system 100.

Referring still to FIG. 1A, the plasma processing system 100 may be configured to process 200 mm substrates, 300 mm substrates, or larger-sized substrates. In fact, it is contemplated that the plasma processing system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

As described above, the processing chamber 110 is configured to facilitate the generation of plasma in process space 115, and generate process chemistry in process space 115 adjacent a surface of the substrate 125. For example, in an etch process, the process gas can include molecular constituents that when dissociated are reactive with the material being etched on the substrate surface. Once plasma is formed in the process space 115, heated electrons can collide with molecules in the process gas causing dissociation and the formation of reactive radicals for performing an etch process, for example.

Figure 1B:
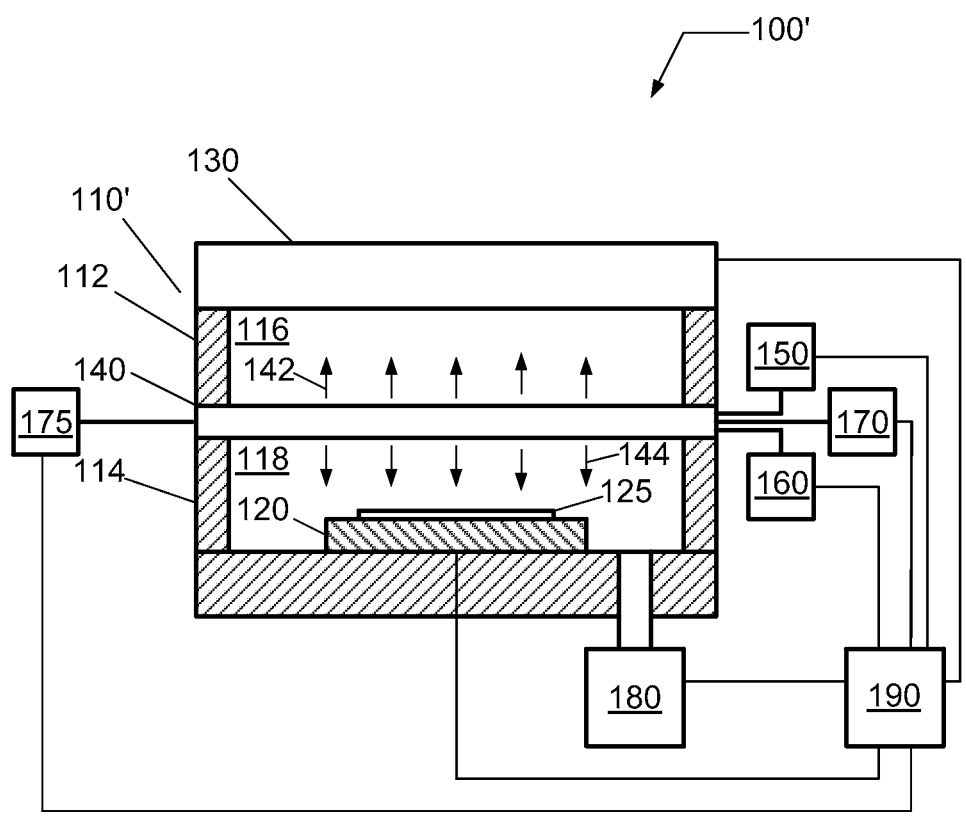
FIG. 1B presents a simplified schematic representation of a plasma processing system according to another embodiment.

Referring now to FIG. 1B, a plasma processing system 100' is presented according to another embodiment. Plasma processing system 100' comprises a processing chamber 110' having an upper chamber portion 112 (i.e., a first chamber portion) configured to define a plasma space 116, and a lower chamber portion 114 (i.e., a second chamber portion) configured to define a process space 118. In the lower chamber portion 114, the processing chamber 110' comprises a substrate holder 120 configured to support a substrate 125. Therein, the substrate 125 is exposed to process chemistry in process space 118. Furthermore, the plasma processing system 100' comprises a plasma source 130 coupled to the upper chamber portion 112, and configured to form plasma in the plasma space 116. The plasma source 130 comprises a surface wave plasma (SWP) source, such as a radial line slot antenna (RLSA), to be discussed below.

As seen in FIG. 1B, the plasma processing system 100' comprises a gas injection grid 140 coupled to the upper chamber portion 112 and the lower chamber portion 114, and located between the plasma space 116 and the process space 118. While FIG. 1B shows the gas injection grid 140 positioned centrally to divide the processing chamber such that the upper chamber portion 112 is substantially equal in size to the lower chamber portion 114, the invention is not limited to this configuration. For example, the gas injection grid 140 can be located within 200 mm from the upper surface of the substrate 125 and, desirably, the gas injection grid 140 is placed within a range of approximately 10 mm to approximately 150 mm from the upper surface of the substrate 125.

In the embodiment of FIG. 1B, the gas injection grid 140 separating the upper chamber portion 112 from the lower chamber portion 114 is configured to introduce a first gas 142 to the plasma space 116 for forming plasma and to introduce a second gas 144 to the process space 118 for forming process chemistry. However, it is not necessary for the first and second gases 142, 144 to be introduced to their respective chamber portions by way of the gas injection grid 140. For example, the plasma source 130 may be configured to supply the first gas 142 to the plasma space 116. More generally, the gas injection grid 140 may not supply gas to the processing chamber 110', or it may supply one or both of the first and second gases 142, 144.

In embodiment of FIG. 1B, a first gas supply system 150 is coupled to the gas injection grid 140, and it is configured to supply the first gas 142. Moreover, a second gas supply system 160 is coupled to the gas injection grid 140, and it is configured to supply the second gas 144. The temperature of the gas injection grid 140 can be controlled using a temperature control system 170, and the electric potential of the gas injection grid 140 can be controlled using an electric bias control system 175.

Furthermore, the plasma processing system 100' includes a pumping system 180 coupled to the processing chamber 110, and configured to evacuate the processing chamber 110', as well as control the pressure within the processing chamber 110'. Optionally, the plasma processing system 100' further includes a control system 190 coupled to the processing chamber 110', the substrate holder 120, the plasma source 130, the gas injection grid 140, the first gas supply system 150, the second gas supply system 160, the temperature control system 170, the electric bias control system 175, and the pumping system 180. The control system 190 can be configured to execute a process recipe for performing at least one of an etch process, and a deposition process in the plasma processing system 100'.

Referring still to FIG. 1B, the plasma processing system 100' may be configured to process 200 mm substrates, 300 mm substrates, or larger-sized substrates. In fact, it is contemplated that the plasma processing system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

As described above, the processing chamber 110' is configured to facilitate the generation of plasma in plasma space 116, and generate process chemistry in process space 118 adjacent a surface of the substrate 125. The first gas 142, which is introduced to the plasma space 116, comprises a plasma forming gas, or an ionizable gas or mixture of gases. The first gas 142 can include an inert gas, such as a Noble gas. The second gas 144, which is introduced to the process space 118, comprises a process gas or mixture of process gases. For example, in an etch process, the process gas can include molecular constituents that when dissociated are reactive with the material being etched on the substrate surface. Once plasma is formed in the plasma space 116, some of the plasma can diffuse into the process space 118 through the gas injection grid 140. The heated electrons having diffused into the process space 118, can collide with molecules in the process gas causing dissociation and the formation of reactive radicals for performing an etch process, for example.

Separate plasma and process spaces such as that shown in exemplary plasma processing system 100' of FIG. 1B may provide improved process control over conventional plasma processing systems. Specifically, the use of a gas injection grid 140, as described above, can, for example, affect the formation of dense, low (to moderate) temperature (i.e., electron temperature $T_e$) plasma in the plasma space 116, while producing a less dense, lower temperature plasma in the process space 118. In doing so, the split injection scheme for the first and second gases can affect a further reduction in the dissociation of the molecular composition in the second gas that is utilized for forming the process chemistry, which provides greater control over the process at the substrate surface.

Additionally, the configuration of exemplary plasma processing system 100' shown in FIG. 1B can reduce damage to chamber components such as the plasma source 130, by preventing process gases from entering the plasma space 116. For example, as an inert gas (i.e., first gas 142), such as argon (Ar), is introduced to the plasma space 116, plasma is formed and neutral Ar atoms are heated. The heated Ar neutral atoms diffuse downwards through the gas injection grid 140, and enter the cooler process space proximate the substrate 125 (e.g., region of lower temperature plasma). This diffusion of Ar neutral gas creates a gas flow into the process space 118 that can reduce or eliminate back-diffusion of the molecular composition in the process gas (i.e., second gas 144).

Still further, the configuration of exemplary plasma processing system 100' shown in FIG. 1B may further reduce substrate damage caused by ion and electron interaction with the substrate 125. In particular, the diffusion of electrons and ions through the gas injection grid 140 into the process space 118 provides fewer electrons and ions in this space relative to the processing system 100 described in FIG. 1A above. Moreover, many of these electrons and ions give up their energy to the dissociation of the process gas. Thus, fewer electrons and ions are available to interact with the substrate 125 and cause damage thereto which is particularly important for low temperature processes because damage to the substrate 125 may not be annealed by the required process temperature.

Figure 2:
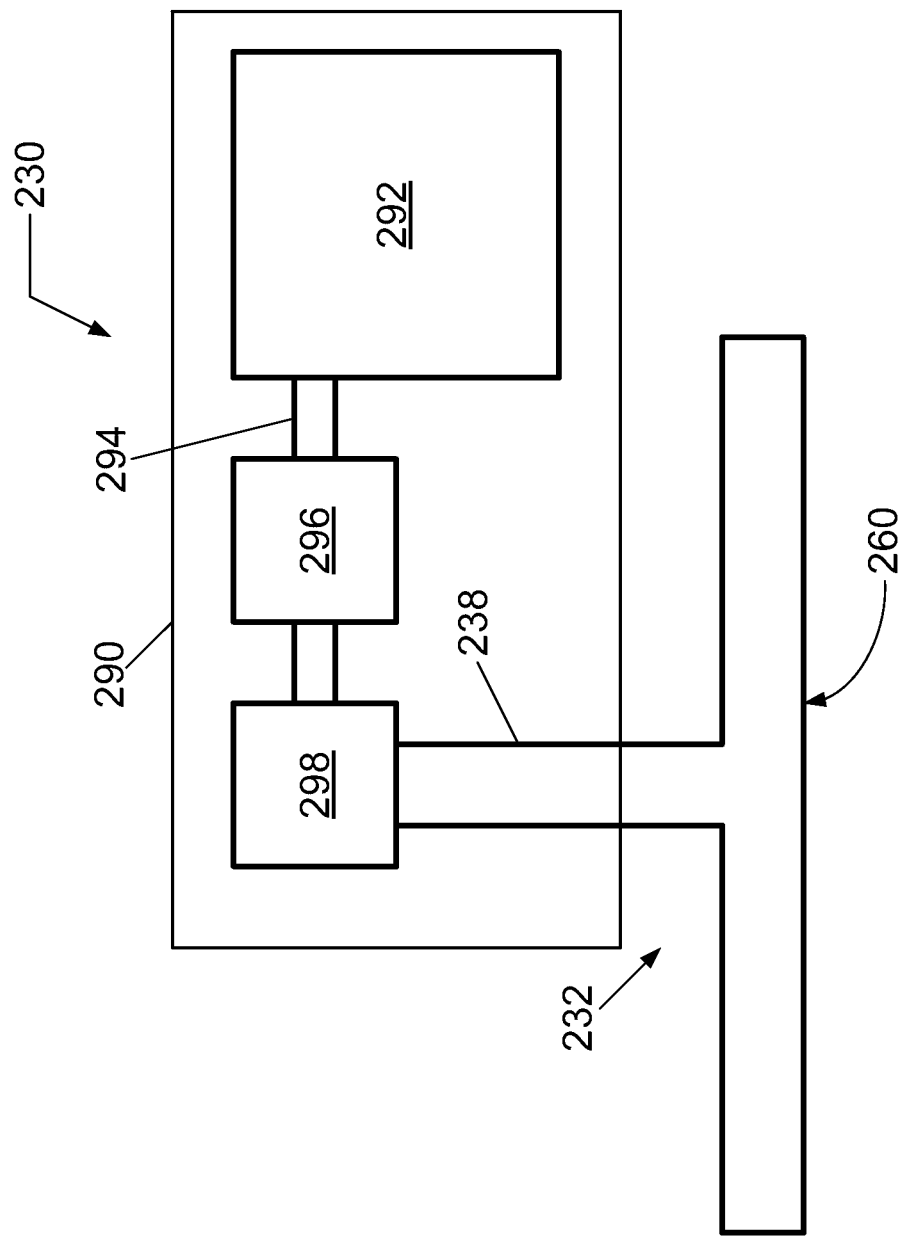
FIG. 2 presents a simplified schematic representation of a surface wave plasma (SWP) source that can be used for the plasma processing system depicted in FIGS. 1A and 1B in accordance with one embodiment.

Referring now to FIG. 2, a schematic representation of a SWP source 230 is provided according to an embodiment. The SWP source 230 comprises an electromagnetic (EM) wave launcher 232 configured to couple EM energy in a desired EM wave mode to a plasma by generating a surface wave on a plasma surface 260 of the EM wave launcher 232 adjacent plasma. Furthermore, the SWP source 230 comprises a power coupling system 290 coupled to the EM wave launcher 232, and configured to provide the EM energy to the EM wave launcher 232 for forming the plasma.

The EM wave launcher 232 includes a microwave launcher configured to radiate microwave power into process space 115 (see FIG. 1A) or plasma space 116 (see FIG. 1B). The EM wave launcher 232 is coupled to the power coupling system 290 via coaxial feed 238 through which microwave energy is transferred. The power coupling system 290 includes a microwave source 292, such as a 2.45 GHz microwave power source. Microwave energy generated by the microwave source 292 is guided through a waveguide 294 to an isolator 296 for absorbing microwave energy reflected back to the microwave source 292. Thereafter, the microwave energy is converted to a coaxial TEM (transverse electromagnetic) mode via a coaxial converter 298. A tuner may be employed for impedance matching, and improved power transfer. The microwave energy is coupled to the EM wave launcher 232 via the coaxial feed 238, wherein another mode change occurs from the TEM mode in the coaxial feed 238 to a TM (transverse magnetic) mode. Additional details regarding the design of the coaxial feed 238 and the EM wave launcher 232 can be found in U.S. Pat. No. 5,024,716, entitled "Plasma processing apparatus for etching, ashing, and film-formation"; the content of which is herein incorporated by reference in its entirety.

Figure 3:
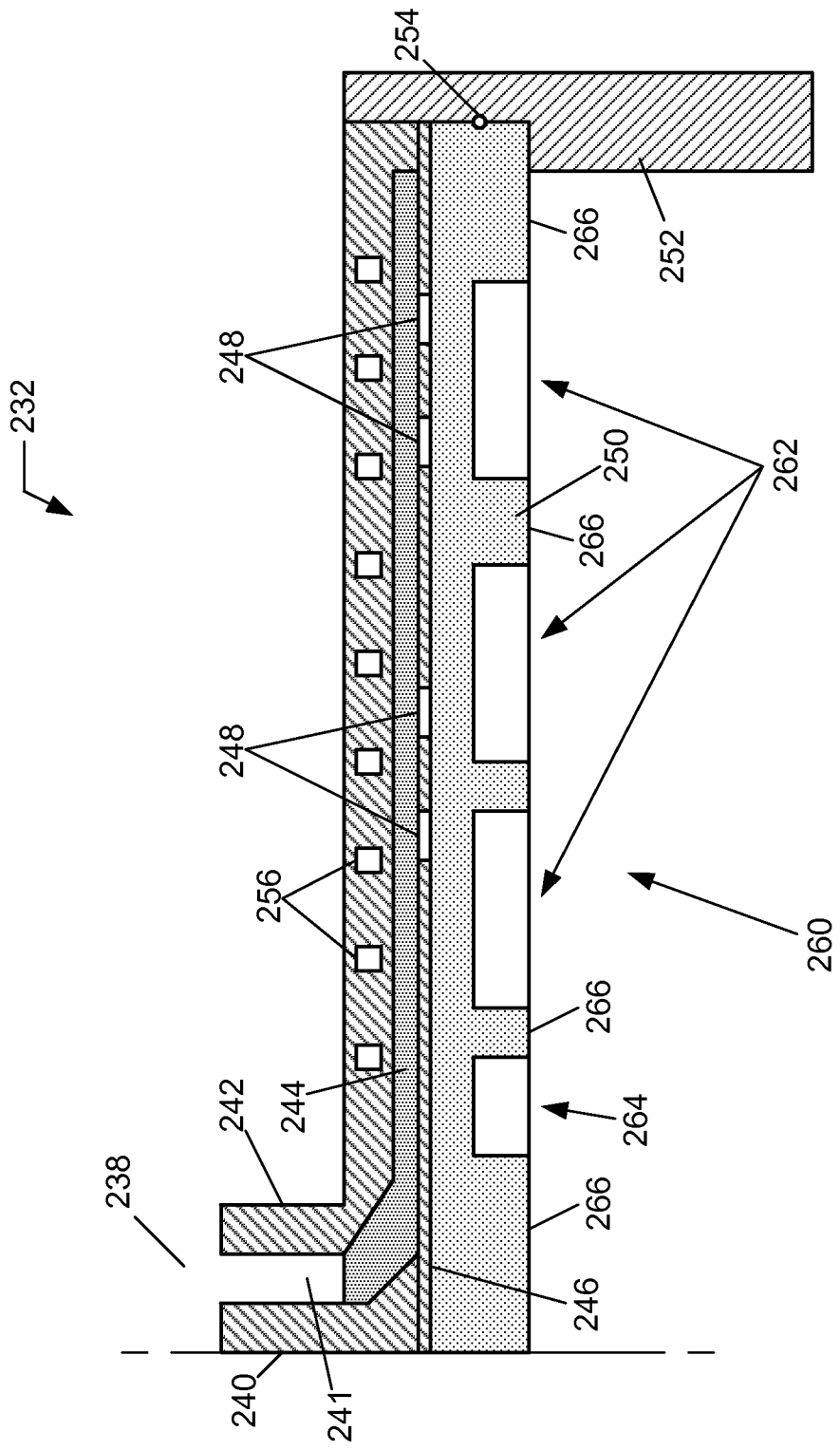
FIG. 3 presents a schematic cross-sectional view of an electromagnetic (EM) wave launcher according to an embodiment.
Figure 4:
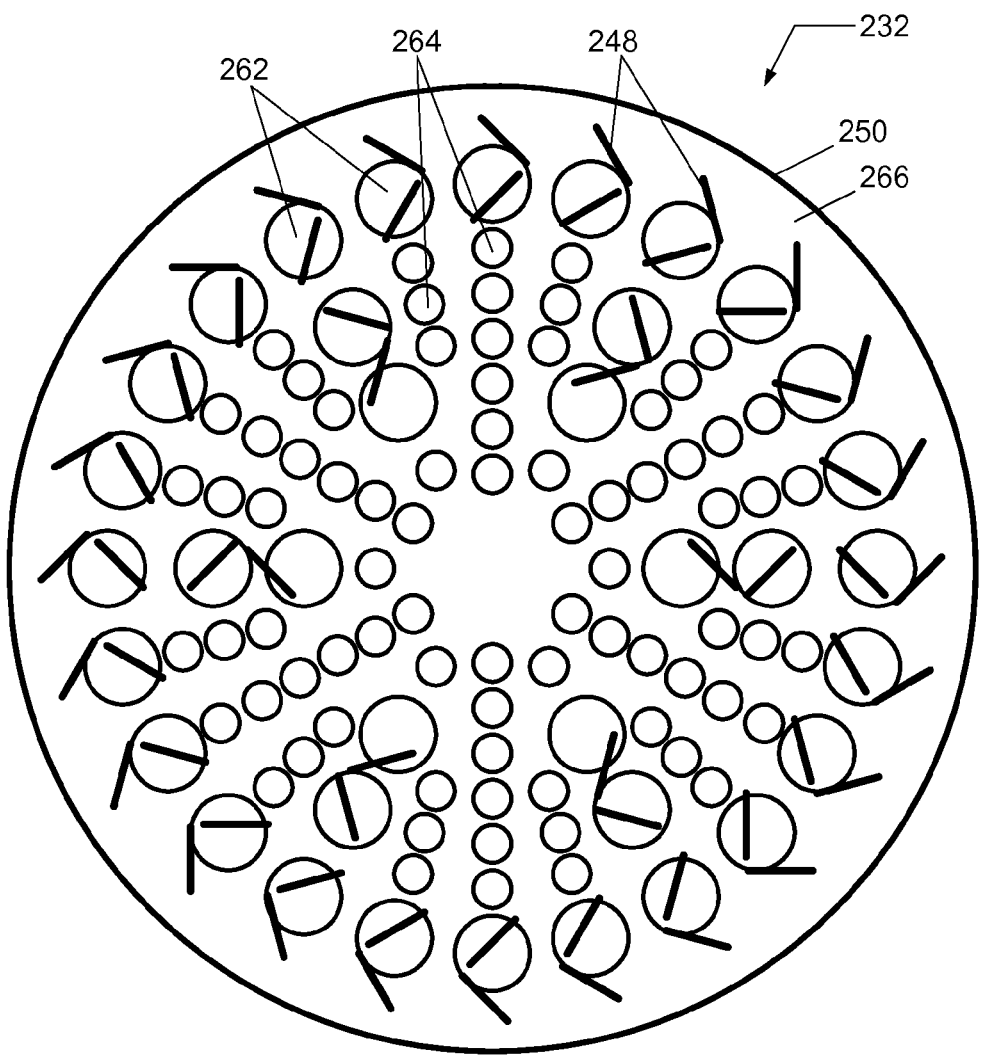
FIG. 4 provides a bottom view of the EM wave launcher depicted in FIG. 3.

Referring now to FIGS. 3 and 4, a schematic cross-sectional view and a bottom view, respectively, of EM wave launcher 232 are provided according to an embodiment. The EM wave launcher 232 comprises the coaxial feed 238 having an inner conductor 240, an outer conductor 242, and insulator 241, and a slot antenna 246 having a plurality of slots 248 coupled between the inner conductor 240 and the outer conductor 242 as shown in FIG. 3. The plurality of slots 248 permits the coupling of EM energy from a first region above the slot antenna 246 to a second region below the slot antenna 246. The EM wave launcher 232 may further comprise a slow wave plate 244, and a resonator plate 250.

The number, geometry, size, and distribution of the slots 248 are all factors that can contribute to the spatial uniformity of the plasma formed in process space 115 (see FIG. 1A) or plasma space 116 (see FIG. 1B). Thus, the design of the slot antenna 246 may be used to control the spatial uniformity of the plasma in process space 115 (see FIG. 1A) or plasma space 116 (see FIG. 1B).

As shown in FIG. 3, the EM wave launcher 232 may comprise a fluid channel 256 that is configured to flow a temperature control fluid for temperature control of the EM wave launcher 232. Although not shown, the EM wave launcher 232 may further be configured to introduce a process gas through the plasma surface 260 to the plasma.

Referring still to FIG. 3, the EM wave launcher 232 may be coupled to an upper chamber portion of a plasma processing system, wherein a vacuum seal can be formed between an upper chamber wall 252 and the EM wave launcher 232 using a sealing device 254. The sealing device 254 can include an elastomer O-ring; however, other known sealing mechanisms may be used.

In general, the inner conductor 240 and the outer conductor 242 of the coaxial feed 238 comprise a conductive material, such as a metal, while the slow wave plate 244 and the resonator plate 250 comprise a dielectric material. In the latter, the slow wave plate 244 and the resonator plate 250 preferably comprise the same material; however, different materials may be used. The material selected for fabrication of the slow wave plate 244 and the resonator plate 250 is chosen to reduce the wavelength of the propagating electromagnetic (EM) wave relative to the corresponding free-space wavelength, and the dimensions of the slow wave plate 244 and the resonator plate 250 are chosen to ensure the formation of a standing wave effective for radiating EM energy into process space 115 (See FIG. 1A) or plasma space 116 (see FIG. 1B).

The slow wave plate 244 and the resonator plate 250 can be fabricated from a dielectric material, including silicon-containing materials such as quartz (silicon dioxide), or a high dielectric constant (high-k) materials. For example, the high-k material may possess a dielectric constant greater than a value of 4. In particular, when the plasma processing system is utilized for etch process applications, quartz is often chosen for compatibility with the etch process.

For example, the high-k material can include intrinsic crystal silicon, alumina ceramic, aluminum nitride, and sapphire. However, other high-k materials may be used. Moreover, a particular high-k material may be selected in accordance with the parameters of a particular process. For example, when the resonator plate 250 is fabricated from intrinsic crystal silicon, the plasma frequency exceeds 2.45 GHz at a temperature of 45 degrees C. Therefore, intrinsic crystal silicon is appropriate for low temperature processes (i.e., less than 45 degrees C). For higher temperature processes, the resonator plate 250 can be fabricated from alumina ($Al_2O_3$), or sapphire.

The inventors have observed that plasma uniformity and plasma stability remain as challenges for the practical implementation of a SWP source as described above. In the latter, the standing wave at the resonator plate-plasma interface, i.e., at the plasma surface 260, may be prone to mode jumps as plasma parameters shift.

As shown in FIGS. 3 and 4, the EM wave launcher 232 is fabricated with a first recess configuration 262 formed in the plasma surface 260 and a second recess configuration 264 formed in the plasma surface 260 according to one embodiment.

The first recess configuration 262 may comprise a first plurality of recesses. Each recess in the first recess configuration 262 may comprise a unique indentation or dimple formed within the plasma surface 260. For example, a recess in the first recess configuration 262 may comprise a cylindrical geometry, a conical geometry, a frusto-conical geometry, a spherical geometry, an aspherical geometry, a rectangular geometry, a pyramidal geometry, or any arbitrary shape. The first recess distribution 262 may comprise recesses characterized by a first size (e.g., latitudinal dimension (or width), and/or longitudinal dimension (or depth)).

The second recess configuration 264 may comprise a plurality of recesses. Each recess in the second recess configuration 264 may comprise a unique indentation or dimple formed within the plasma surface 260. For example, a recess in the second recess configuration 264 may comprise a cylindrical geometry, a conical geometry, a frusto-conical geometry, a spherical geometry, an aspherical geometry, a rectangular geometry, a pyramidal geometry, or any arbitrary shape. The second recess distribution 264 may comprise recesses characterized by a second size (e.g., latitudinal dimension (or width), and/or longitudinal dimension (or depth)). The first size of the recesses in the first recess configuration 262 may or may not be the same as the second size of the recesses in the second recess configuration 264. For instance, the second size may be smaller than the first size.

As shown in FIGS. 3 and 4, the resonator plate 250 comprises a dielectric plate having a plate diameter and a plate thickness. Therein, the plasma surface 260 on resonator plate 250 comprises a planar surface 266 within which the first recess configuration 262 and the second recess configuration 264 are formed. Alternatively, the resonator plate 250 comprises an arbitrary geometry. Therein, the plasma surface 260 may comprise a non-planar surface within which the first recess configuration and the second recess configuration are formed (not shown). For example, the non-planar surface may be concave, or convex, or a combination thereof.

The propagation of EM energy in the resonator plate 250 may be characterized by an effective wavelength ($\lambda$) for a given frequency of EM energy and dielectric constant for the resonator plate 250. The plate thickness may be an integer number of quarter wavelengths ($n\lambda/4$, where n is an integer greater than zero) or an integer number of half wavelengths ($m\lambda/2$, where m is an integer greater than zero). For instance, the plate thickness may be about half the effective wavelength ($\lambda/2$) or greater than half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 262 may comprise a first plurality of cylindrical recesses, wherein each of the first plurality of cylindrical recesses is characterized by a first depth and a first diameter. As shown in FIG. 4, the first recess configuration 262 is located near an outer region of the plasma surface 260.

The first diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a first difference between the plate thickness and the first depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the first diameter may be about half the effective wavelength ($\lambda/2$), and the first difference between the plate thickness and the first depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the first diameter may range from about 25 mm to about 35 mm, and the first difference between the plate thickness and the first depth may range from about 10 mm to about 35 mm. Alternatively yet, the first diameter may range from about 30 mm to about 35 mm, and the first difference may range from about 10 mm to about 20 mm. Alternatively yet, the first diameter and/or first depth may be a fraction of the plate thickness.

In the first recess configuration 262, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 260. For example, the surface radius may range from about 1 mm to about 3 mm.

As another example, the second recess configuration 264 may comprise a second plurality of cylindrical recesses, each of the second plurality of cylindrical recesses being characterized by a second depth and a second diameter. As shown in FIG. 4, the second recess configuration 264 is located near an inner region of the plasma surface 260.

The second diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a second difference between the plate thickness and the second depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the second diameter may be about half the effective wavelength ($\lambda/2$), and the second difference between the plate thickness and the second depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the second diameter may range from about 25 mm to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or second depth may be a fraction of the plate thickness.

In the second recess configuration 264, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 260. For example, the surface radius may range from about 1 mm to about 3 mm.

Referring again to FIG. 4, a bottom view of the EM wave launcher 232 depicted in FIG. 3 is provided. The plurality of slots 248 in slot antenna 246 are illustrated as if one can see through resonator plate 250 to the slot antenna 246. As shown in FIG. 4, the plurality of slots 248 may be arranged in pairs, wherein each of the pair of slots comprises a first slot oriented orthogonal to a second slot. However, the orientation of slots in the plurality of slots 248 may be arbitrary. For example, the orientation of slots in the plurality of slots 248 may be according to a pre-determined pattern for plasma uniformity and/or plasma stability.

The first recess configuration 262 is substantially aligned with a first arrangement of slots in the plurality of slots 248. Therein, at least one recess of the first recess configuration 262 is aligned with one or more of the plurality of slots 248. The second recess configuration 264 is either partly aligned with a second arrangement of slots in the plurality of slots 248 or not aligned with the second arrangement of slots in the plurality of slots 248. As shown in FIG. 4, the second recess configuration 264 is not aligned with the second arrangement of slots in the plurality of slots 248.

As a consequence, the inventors have observed that the first recess configuration 262 dominate plasma generation, and exhibit a relatively "full bright" glow across a range of power coupled to the EM wave launcher 232 and a range of pressure in the space where plasma is formed adjacent the plasma surface 260. Further, the inventors have observed that the second recess configuration 264 variably contribute to plasma generation, and exhibit a variation from a relatively "dim" glow to a "bright" glow depending on the power and/or pressure. The regions adjacent the planar surface 266 receive less power and, generally, remain relatively "dark" except at relatively high power.

Moreover, the inventors have observed that plasma formed in the first recess configuration 262 (i.e., aligned with the plurality of slots 248) is stable at low power. Plasma is formed via ionization proximate these (larger) dimples, and flows from the recesses of the first recess configuration 262 to recesses of the second recess configuration 264 (i.e., not aligned/partly aligned with the plurality of slots 248). As a result, plasma formed proximate these recesses of the first recess configuration 262 is stable over a wide range of power and pressure, as the recesses of the second recess configuration 264 receive an "overflow" of plasma from the recesses of the first recess configuration 262 and compensate for fluctuations in the plasma generation proximate the recesses of the first recess configuration 262.

For improved control of plasma uniformity, the regions adjacent the planar surface 266 should remain relatively "dark" so that the risk for development of a mode-pattern is reduced. Therefore, as illustrated in FIG. 4, the optimal placement of the first recess configuration 262 and the second recess configuration 264 may be such that a relatively large number of recesses (of the first recess configuration 262), aligned with the plurality of slots 248 in slot antenna 246, and a relatively large number of recesses (of the second recess configuration 264), not aligned with the plurality of slots 248, are collectively arranged spatially for plasma uniformity, for example. Although, the arrangement of recesses may be chosen to achieve plasma uniformity, it may also be desirable to achieve a non-uniform plasma that cooperates with other process parameters to achieve a uniform process at a surface of a substrate being processed by the plasma.

Figure 5A:
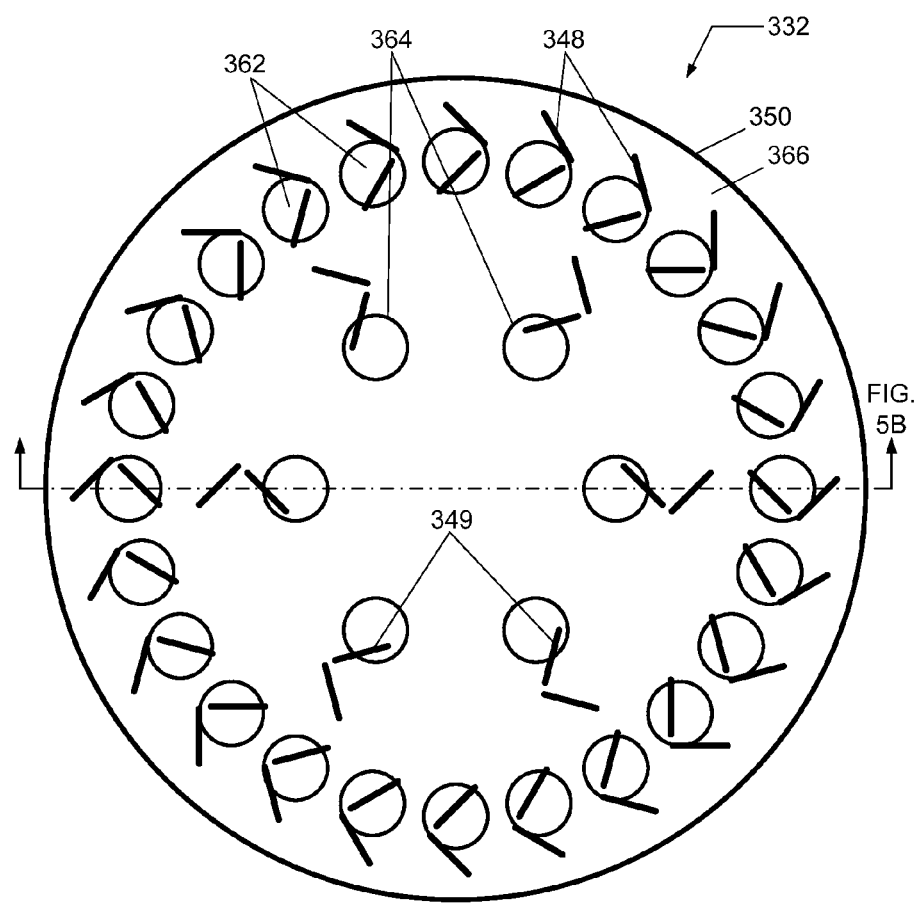
FIG. 5A provides a bottom view of an EM wave launcher according to another embodiment.
Figure 5B:
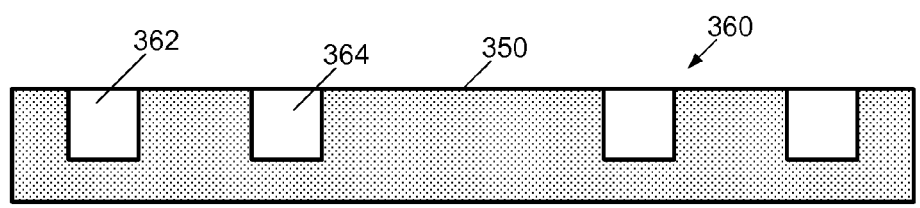
FIG. 5B presents a schematic cross-sectional view of a portion of the EM wave launcher depicted in FIG. 5A.

Referring now to FIGS. 5A and 5B, a bottom view and a schematic cross-sectional view, respectively, of EM wave launcher 332 are provided according to another embodiment. The EM wave launcher 332 comprises a resonator plate 350 with plasma surface 360. The EM wave launcher 332 further comprises a slot antenna having a first plurality of slots 348 and a second plurality of slots 349. The first plurality of slots 348 and the second plurality of slots 349 permit the coupling of EM energy from a first region above the slot antenna to a second region below the slot antenna wherein the resonator plate 350 is located.

The number, geometry, size, and distribution of the slots 348, 349 are all factors that can contribute to the spatial uniformity of the plasma formed in process space 115 (see FIG. 1A) or plasma space 116 (see FIG. 1B). Thus, the design of the slot antenna may be used to control the spatial uniformity of the plasma in process space 115 (see FIG. 1A) or plasma space 116 (see FIG. 1B).

As shown in FIGS. 5A and 5B, the EM wave launcher 332 is fabricated with a first recess configuration 362 formed in the plasma surface 360 and a second recess configuration 364 formed in the plasma surface 360 according to one embodiment.

The first recess configuration 362 may comprise a first plurality of recesses. Each recess in the first recess configuration 362 may comprise a unique indentation or dimple formed within the plasma surface 360. For example, a recess in the first recess configuration 362 may comprise a cylindrical geometry, a conical geometry, a frusto-conical geometry, a spherical geometry, an aspherical geometry, a rectangular geometry, a pyramidal geometry, or any arbitrary shape. The first recess distribution 362 may comprise recesses characterized by a first size (e.g., latitudinal dimension (or width), and/or longitudinal dimension (or depth)).

The second recess configuration 364 may comprise a plurality of recesses. Each recess in the second recess configuration 364 may comprise a unique indentation or dimple formed within the plasma surface 360. For example, a recess in the second recess configuration 364 may comprise a cylindrical geometry, a conical geometry, a frusto-conical geometry, a spherical geometry, an aspherical geometry, a rectangular geometry, a pyramidal geometry, or any arbitrary shape. The second recess distribution 364 may comprise recesses characterized by a second size (e.g., latitudinal dimension (or width), and/or longitudinal dimension (or depth)). The first size of the recesses in the first recess configuration 362 may or may not be the same as the second size of the recesses in the second recess configuration 364. For instance, the second size may be smaller than the first size.

As shown in FIGS. 5A and 5B, the resonator plate 350 comprises a dielectric plate having a plate diameter and a plate thickness. Therein, the plasma surface 360 on resonator plate 350 comprises a planar surface 366 within which the first recess configuration 362 and the second recess configuration 364 are formed. Alternatively, the resonator plate 350 comprises an arbitrary geometry. Therein, the plasma surface 360 may comprise a non-planar surface 366 within which the first recess configuration 362 and the second recess configuration 364 are formed (not shown). For example, the non-planar surface may be concave, or convex, or a combination thereof.

The propagation of EM energy in the resonator plate 350 may be characterized by an effective wavelength ($\lambda$) for a given frequency of EM energy and dielectric constant for the resonator plate 350. The plate thickness may be an integer number of quarter wavelengths ($n\lambda/4$, where n is an integer greater than zero) or an integer number of half wavelengths ($m\lambda/2$, where m is an integer greater than zero). For instance, the plate thickness may be about a half wavelength thick ($\lambda/2$) or greater than about half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 362 may comprise a first plurality of cylindrical recesses, wherein each of the first plurality of cylindrical recesses is characterized by a first depth and a first diameter. As shown in FIG. 5A, the first recess configuration 362 is located near an outer region of the plasma surface 360.

The first diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a first difference between the plate thickness and the first depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the first diameter may be about half the effective wavelength ($\lambda/2$), and the first difference between the plate thickness and the first depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the first diameter may range from about 25 mm to about 35 mm, and the first difference between the plate thickness and the first depth may range from about 10 mm to about 35 mm. Alternatively yet, the first diameter may range from about 30 mm to about 35 mm, and the first difference may range from about 10 mm to about 20 mm. Alternatively yet, the first diameter and/or first depth may be a fraction of the plate thickness.

In the first recess configuration 362, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 360. For example, the surface radius may range from about 1 mm to about 3 mm.

As another example, the second recess configuration 364 may comprise a second plurality of cylindrical recesses, each of the second plurality of cylindrical recesses being characterized by a second depth and a second diameter. As shown in FIG. 5A, the second recess configuration 364 is located near an inner region of the plasma surface 360.

The second diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a second difference between the plate thickness and the second depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the second diameter may be about half the effective wavelength ($\lambda/2$), and the second difference between the plate thickness and the second depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the second diameter may range from about 25 mm to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or the second depth may be a fraction of the plate thickness.

In the second recess configuration 364, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 360. For example, the surface radius may range from about 1 mm to about 3 mm.

The first plurality of slots 348 and the second plurality of slots 349 in the slot antenna are illustrated as if one can see through resonator plate 350 to the slot antenna. As shown in FIG. 5A, the first plurality of slots 348 and the second plurality of slots 349 may be arranged in pairs, wherein each of the pair of slots comprises a first slot oriented orthogonal to a second slot. However, the orientation of slots in the first plurality of slots 348 and the second plurality of slots 349 may be arbitrary. For example, the orientation of slots in the first plurality of slots 348 and the second plurality of slots 349 may be according to a pre-determined pattern for plasma uniformity and/or plasma stability.

The first recess configuration 362 is substantially aligned with the first plurality of slots 348. Therein, at least one recess of the first recess configuration 362 is aligned with one or more of the first plurality of slots 348. The second recess configuration 364 is either partly aligned with the second plurality of slots 349 or not aligned with the second plurality of slots 349. As shown in FIG. 5A, the second recess configuration 364 is partly aligned with the second plurality of slots 349, wherein the second recess configuration 364 possesses a partially direct overlap with a slot (e.g., a fraction of a slot is in direct view of a recess).

Figure 6A:
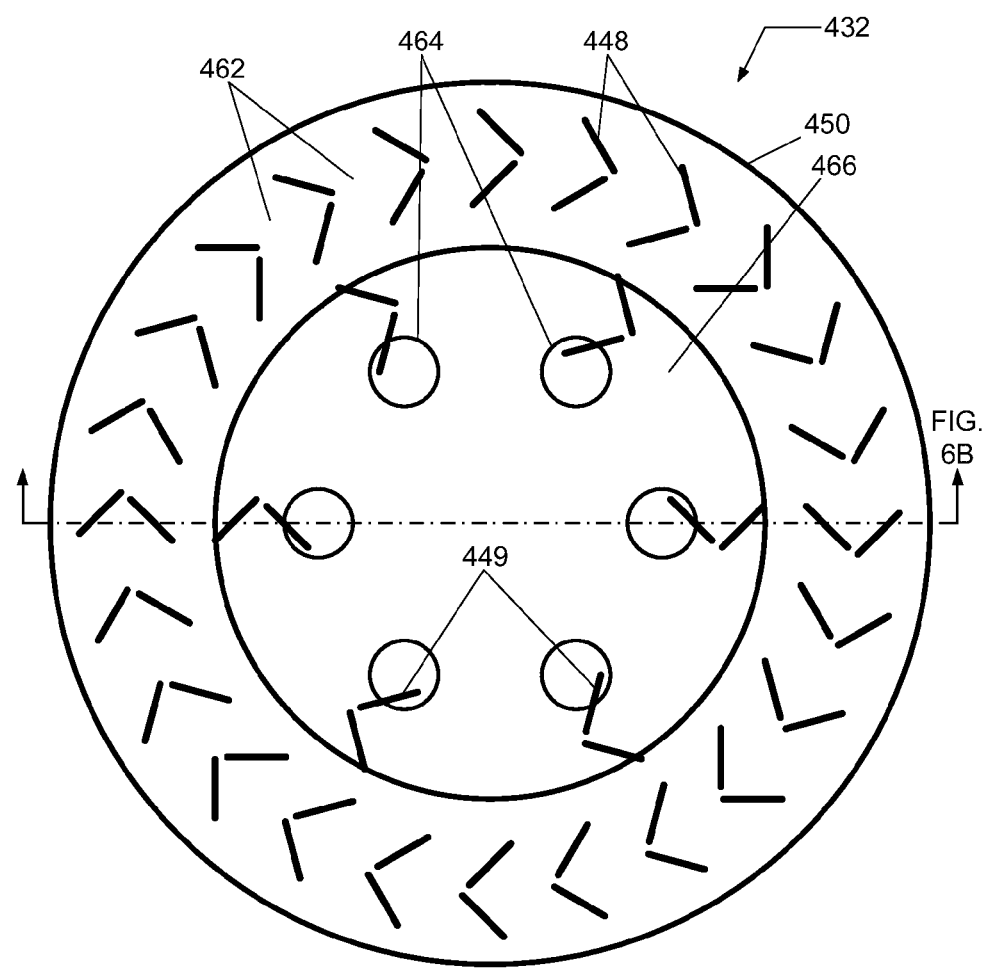
FIG. 6A provides a bottom view of an EM wave launcher according to another embodiment.
Figure 6B:
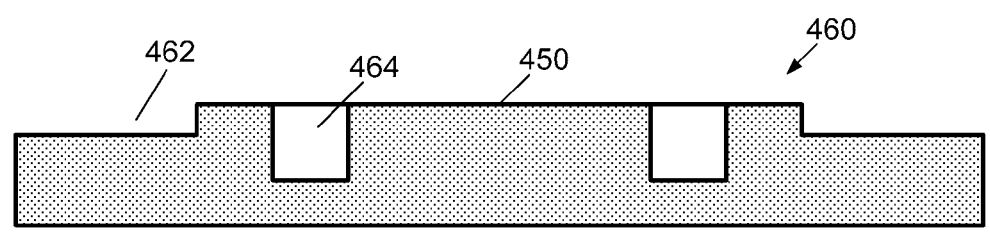
FIG. 6B presents a schematic cross-sectional view of a portion of the EM wave launcher depicted in FIG. 6A.

Referring now to FIGS. 6A and 6B, a bottom view and a schematic cross-sectional view, respectively, of EM wave launcher 432 are provided according to another embodiment. The EM wave launcher 432 comprises a resonator plate 450 with plasma surface 460. The EM wave launcher 432 further comprises a slot antenna having a first plurality of slots 448 and a second plurality of slots 449. The first plurality of slots 448 and the second plurality of slots 449 permit the coupling of EM energy from a first region above the slot antenna to a second region below the slot antenna wherein the resonator plate 450 is located.

The number, geometry, size, and distribution of the slots 448, 449 are all factors that can contribute to the spatial uniformity of the plasma formed in process space 115 (see FIG. 1A) or plasma space 116 (see FIG. 1B). Thus, the design of the slot antenna may be used to control the spatial uniformity of the plasma in process space 115 (see FIG. 1A) or plasma space 116 (see FIG. 1B).

As shown in FIGS. 6A and 6B, the EM wave launcher 432 is fabricated with a first recess configuration 462 formed in the plasma surface 460 and a second recess configuration 464 formed in the plasma surface 460 according to one embodiment.

The first recess configuration 462 may comprise a shelf. The shelf in the first recess configuration 462 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The first recess distribution 462 may comprise a shelf characterized by a first size (e.g., latitudinal dimension (or width), and/or longitudinal dimension (or depth)).

The second recess configuration 464 may comprise a plurality of recesses. Each recess in the second recess configuration 464 may comprise a unique indentation or dimple formed within the plasma surface 460. For example, a recess in the second recess configuration 464 may comprise a cylindrical geometry, a conical geometry, a frusto-conical geometry, a spherical geometry, an aspherical geometry, a rectangular geometry, a pyramidal geometry, or any arbitrary shape. The second recess distribution 464 may comprise recesses characterized by a second size (e.g., latitudinal dimension (or width), and/or longitudinal dimension (or depth)). The first size of the shelf in the first recess configuration 462 may or may not be the same as the second size of the recesses in the second recess configuration 464. For instance, the second size may be smaller than the first size.

As shown in FIGS. 6A and 6B, the resonator plate 450 comprises a dielectric plate having a plate diameter and a plate thickness. Therein, the plasma surface 460 on resonator plate 450 comprises a planar surface 466 within which the first recess configuration 462 and the second recess configuration 464 are formed. Alternatively, the resonator plate 450 comprises an arbitrary geometry. Therein, the plasma surface 460 may comprise a non-planar surface within which the first recess configuration and the second recess configuration are formed (not shown). For example, the non-planar surface may be concave, or convex, or a combination thereof.

The propagation of EM energy in the resonator plate 450 may be characterized by an effective wavelength ($\lambda$) for a given frequency of EM energy and dielectric constant for the resonator plate 450. The plate thickness may be an integer number of quarter wavelengths ($n\lambda/4$, where n is an integer greater than zero) or an integer number of half wavelengths ($m\lambda/2$, where m is an integer greater than zero). For instance, the plate thickness may be about half the effective wavelength ($\lambda/2$) or greater than half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 462 may comprise an annular shelf, wherein the annular shelf is characterized by a first shelf depth and a first shelf width (or a first inner shelf radius and a first outer shelf radius). As shown in FIG. 6A, the first recess configuration 462 is located a peripheral edge of the plasma surface 460.

The first shelf width may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a first difference between the plate thickness and the first shelf depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the first shelf width may be about the effective wavelength ($\lambda$), and a first difference between the plate thickness and the first shelf depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the first shelf width may range from about 25 mm to about 75 mm, and the first difference between the plate thickness and the first shelf depth may range from about 10 mm to about 35 mm. Alternatively yet, the first shelf width may range from about 55 mm to about 65 mm, and the first difference may range from about 10 mm to about 20 mm. Alternatively yet, the first shelf width and/or the first shelf depth may be a fraction of the plate thickness.

In the first recess configuration 462, chamfers, rounds and/or fillets (i.e., surface/corner radius or bevel) may be utilized to affect smooth surface transitions between adjacent surfaces. In an annular shelf recess, a surface radius may be disposed at the corner between the cylindrical sidewall and the bottom of the recess. Additionally, in an annular shelf recess, a surface radius may be disposed at the corner between the cylindrical sidewall and the plasma surface 460. For example, the surface radius may range from about 1 mm to about 3 mm.

As another example, the second recess configuration 464 may comprise a second plurality of cylindrical recesses, each of the second plurality of cylindrical recesses being characterized by a second depth and a second diameter. As shown in FIG. 6A, the second recess configuration 464 is located near an inner region of the plasma surface 460. Although not shown, the second recess configuration 464 may comprise a second shelf, such as a second annular shelf that is characterized by a second shelf depth and a second shelf width (or second inner shelf radius and second outer shelf radius).

The second diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a second difference between the plate thickness and the second depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the second diameter may be about half the effective wavelength ($\lambda/2$) or about quarter the effective wavelength ($\lambda/4$), and a second difference between the plate thickness and the second depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the second diameter may range from about 25 mm (millimeters) to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or the second depth may be a fraction of the plate thickness.

In the second recess configuration 464, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, the recess, a surface radius may be disposed at the corner between the cylindrical sidewall and the plasma surface 460. For example, the surface radius may range from about 1 mm to about 3 mm.

The first plurality of slots 448 and the second plurality of slots 449 in the slot antenna are illustrated as if one can see through resonator plate 450 to the slot antenna. As shown in FIG. 6A, the first plurality of slots 448 and the second plurality of slots 449 may be arranged in pairs, wherein each of the pair of slots comprises a first slot oriented orthogonal to a second slot. However, the orientation of slots in the first plurality of slots 448 and the second plurality of slots 449 may be arbitrary. For example, the orientation of slots in the first plurality of slots 448 and the second plurality of slots 449 may be according to a pre-determined pattern for plasma uniformity and/or plasma stability.

The first recess configuration 462 is substantially aligned with the first plurality of slots 448. The second recess configuration 464 is either partly aligned with the second plurality of slots 449 or not aligned with the second plurality of slots 449. As shown in FIG. 6A, the second recess configuration 464 is partly aligned with the second plurality of slots 449, wherein the second recess configuration 464 possesses a partial direct overlap with a slot.

Figure 7A:
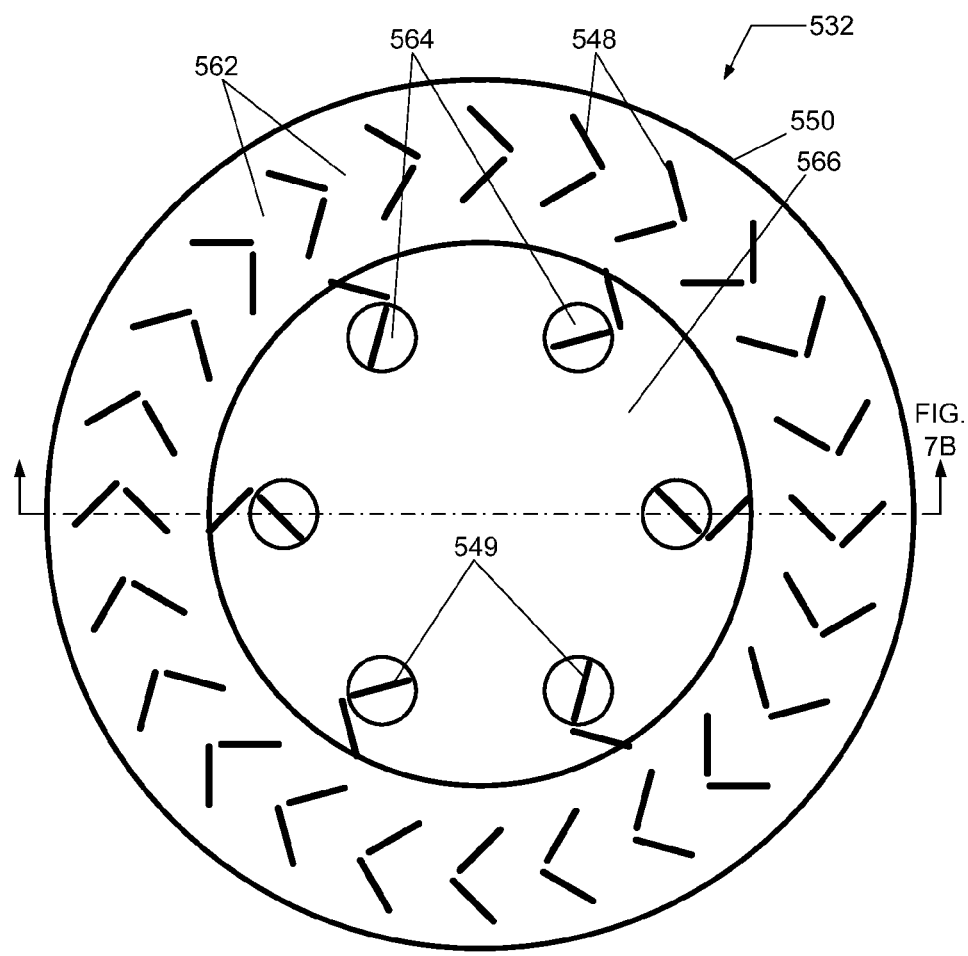
FIG. 7A provides a bottom view of an EM wave launcher according to another embodiment.
Figure 7B:
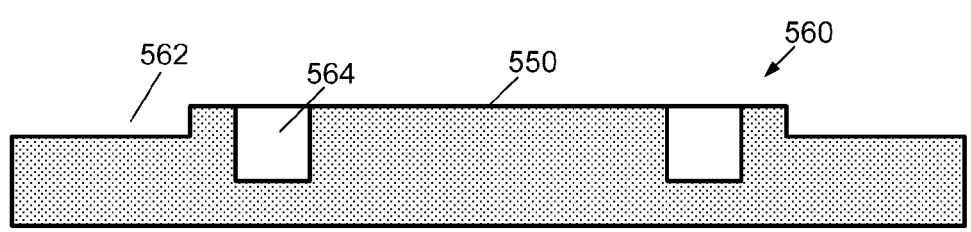
FIG. 7B presents a schematic cross-sectional view of a portion of the EM wave launcher depicted in FIG. 7A.

Referring now to FIGS. 7A and 7B, a bottom view and a schematic cross-sectional view, respectively, of EM wave launcher 532 are provided according to another embodiment. The EM wave launcher 532 comprises a resonator plate 550 with plasma surface 560. The EM wave launcher 532 further comprises a slot antenna having a first plurality of slots 548 and a second plurality of slots 549. The first plurality of slots 548 and the second plurality of slots 549 permit the coupling of EM energy from a first region above the slot antenna to a second region below the slot antenna wherein the resonator plate 550 is located.

The number, geometry, size, and distribution of the slots 548, 549 are all factors that can contribute to the spatial uniformity of the plasma formed in process space 115 (see FIG. 1A) or plasma space 116 (see FIG. 1B). Thus, the design of the slot antenna may be used to control the spatial uniformity of the plasma in process space 115 (see FIG. 1A) or plasma space 116 (see FIG. 1B).

As shown in FIGS. 7A and 7B, the EM wave launcher 532 is fabricated with a first recess configuration 562 formed in the plasma surface 560 and a second recess configuration 564 formed in the plasma surface 560 according to one embodiment.

The first recess configuration 562 may comprise a shelf. The shelf in the first recess configuration 562 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The first recess distribution 562 may comprise a shelf characterized by a first size (e.g., latitudinal dimension (or width), and/or longitudinal dimension (or depth)).

The second recess configuration 564 may comprise a plurality of recesses. Each recess in the second recess configuration 564 may comprise a unique indentation or dimple formed within the plasma surface 560. For example, a recess in the second recess configuration 564 may comprise a cylindrical geometry, a conical geometry, a frusto-conical geometry, a spherical geometry, an aspherical geometry, a rectangular geometry, a pyramidal geometry, or any arbitrary shape. The second recess distribution 564 may comprise recesses characterized by a second size (e.g., latitudinal dimension (or width), and/or longitudinal dimension (or depth)). The first size of the shelf in the first recess configuration 562 may or may not be the same as the second size of the recesses in the second recess configuration 564. For instance, the second size may be smaller than the first size.

As shown in FIGS. 7A and 7B, the resonator plate 550 comprises a dielectric plate having a plate diameter and a plate thickness. Therein, the plasma surface 560 on resonator plate 550 comprises a planar surface 566 within which the first recess configuration 562 and the second recess configuration 564 are formed. Alternatively, the resonator plate 550 comprises an arbitrary geometry. Therein, the plasma surface 560 may comprise a non-planar surface within which the first recess configuration and the second recess configuration are formed (not shown). For example, the non-planar surface may be concave, or convex, or a combination thereof.

The propagation of EM energy in the resonator plate 550 may be characterized by an effective wavelength ($\lambda$) for a given frequency of EM energy and dielectric constant for the resonator plate 550. The plate thickness may be an integer number of quarter wavelengths ($n\lambda/4$, where n is an integer greater than zero) or an integer number of half wavelengths ($m\lambda/2$, where m is an integer greater than zero). For instance, the plate thickness may be about half the effective wavelength ($\lambda/2$) or greater than half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 562 may comprise an annular shelf, wherein the annular shelf is characterized by a first shelf depth and a first shelf width (or a first inner shelf radius and first outer shelf radius). As shown in FIG. 7A, the first recess configuration 562 is located a peripheral edge of the plasma surface 560.

The first shelf width may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a first difference between the plate thickness and the first shelf depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the first shelf width may be about the effective wavelength ($\lambda$), and a first difference between the plate thickness and the first shelf depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the first shelf width may range from about 25 mm to about 75 mm, and the first difference between the plate thickness and the first shelf depth may range from about 10 mm to about 35 mm. Alternatively yet, the first shelf width may range from about 55 mm to about 65 mm, and the first difference may range from about 10 mm to about 20 mm.

Alternatively yet, the first shelf width and/or the first shelf depth may be a fraction of the plate thickness.

In the first recess configuration 562, chamfers, rounds and/or fillets (i.e., surface/corner radius or bevel) may be utilized to affect smooth surface transitions between adjacent surfaces. In an annular shelf recess, a surface radius may be disposed at the corner between the cylindrical sidewall and the bottom of the recess. Additionally, in an annular shelf recess, a surface radius may be disposed at the corner between the cylindrical sidewall and the plasma surface 560. For example, the surface radius may range from about 1 mm to about 3 mm.

As another example, the second recess configuration 564 may comprise a second plurality of cylindrical recesses, each of the second plurality of cylindrical recesses being characterized by a second depth and a second diameter. As shown in FIG. 7A, the second recess configuration 564 is located near an inner region of the plasma surface 560. Although not shown, the second recess configuration 564 may comprise a second shelf, such as a second annular shelf that is characterized by a second shelf depth and a second shelf width (or second inner shelf radius and second outer shelf radius).

The second diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a second difference between the plate thickness and the second depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the second diameter may be about half the effective wavelength ($\lambda/2$) or about quarter the effective wavelength ($\lambda/4$), and a second difference between the plate thickness and the second depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the second diameter may range from about 25 mm (millimeters) to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or the second depth may be a fraction of the plate thickness.

In the second recess configuration 564, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, the recess, a surface radius may be disposed at the corner between the cylindrical sidewall and the plasma surface 560. For example, the surface radius may range from about 1 mm to about 3 mm.

The first plurality of slots 548 and the second plurality of slots 549 in the slot antenna are illustrated as if one can see through resonator plate 550 to the slot antenna. As shown in FIG. 7A, the first plurality of slots 548 and the second plurality of slots 549 may be arranged in pairs, wherein each of the pair of slots comprises a first slot oriented orthogonal to a second slot. However, the orientation of slots in the first plurality of slots 548 and the second plurality of slots 549 may be arbitrary. For example, the orientation of slots in the first plurality of slots 548 and the second plurality of slots 549 may be according to a pre-determined pattern for plasma uniformity and/or plasma stability.

The first recess configuration 562 is substantially aligned with the first plurality of slots 548. The second recess configuration 564 is either aligned, partly aligned, or not aligned with the second plurality of slots 549. As shown in FIG. 7A, the second recess configuration 564 is substantially aligned with the second plurality of slots 549.

Figure 8A:
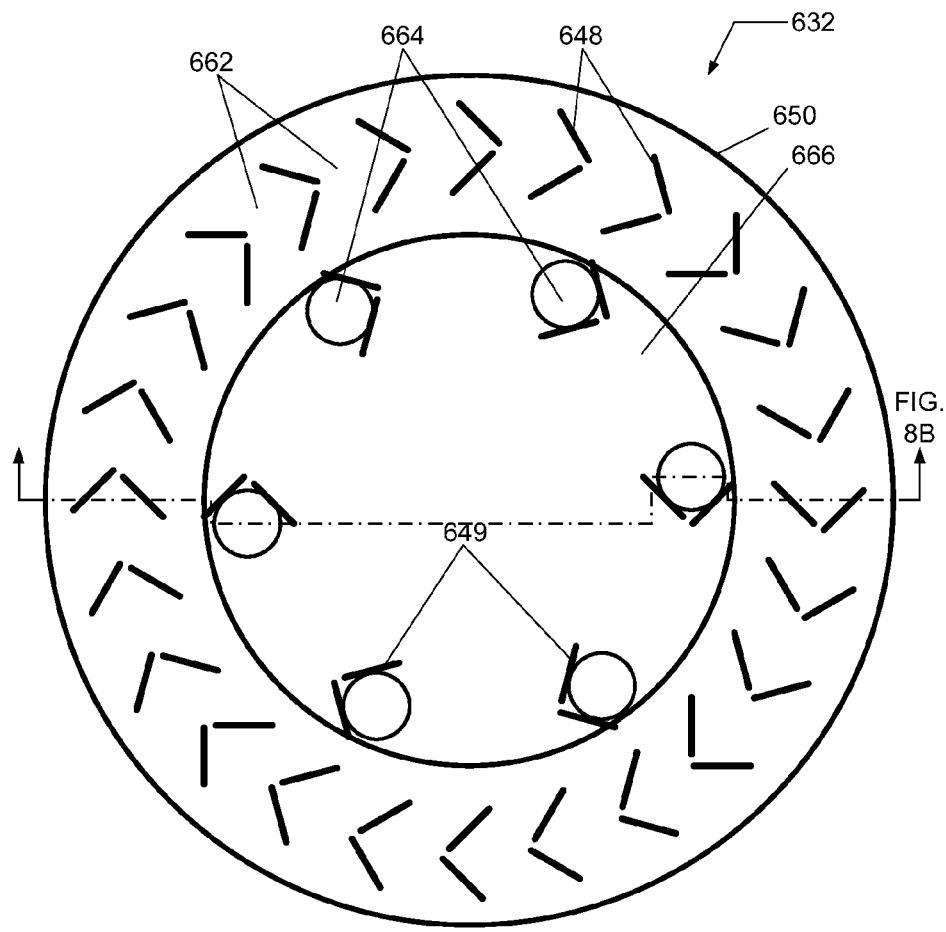
FIG. 8A provides a bottom view of an EM wave launcher according to another embodiment.
Figure 8B:
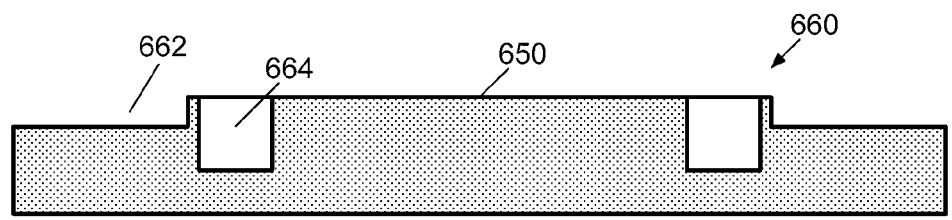
FIG. 8B presents a schematic cross-sectional view of a portion of the EM wave launcher depicted in FIG. 8A.

Referring now to FIGS. 8A and 8B, a bottom view and a schematic cross-sectional view, respectively, of EM wave launcher 632 are provided according to another embodiment. The EM wave launcher 632 comprises a resonator plate 650 with plasma surface 660. The EM wave launcher 632 further comprises a slot antenna having a first plurality of slots 648 and a second plurality of slots 649. The first plurality of slots 648 and the second plurality of slots 649 permit the coupling of EM energy from a first region above the slot antenna to a second region below the slot antenna wherein the resonator plate 650 is located.

The number, geometry, size, and distribution of the slots 648, 649 are all factors that can contribute to the spatial uniformity of the plasma formed in process space 115 (see FIG. 1A) or plasma space 116 (see FIG. 1B). Thus, the design of the slot antenna may be used to control the spatial uniformity of the plasma in process space 115 (see FIG. 1A) or plasma space 116 (see FIG. 1B).

As shown in FIGS. 8A and 8B, the EM wave launcher 632 is fabricated with a first recess configuration 662 formed in the plasma surface 660 and a second recess configuration 664 formed in the plasma surface 660 according to one embodiment.

The first recess configuration 662 may comprise a shelf. The shelf in the first recess configuration 662 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The first recess distribution 662 may comprise a shelf characterized by a first size (e.g., latitudinal dimension (or width), and/or longitudinal dimension (or depth)).

The second recess configuration 664 may comprise a plurality of recesses. Each recess in the second recess configuration 664 may comprise a unique indentation or dimple formed within the plasma surface 660. For example, a recess in the second recess configuration 664 may comprise a cylindrical geometry, a conical geometry, a frusto-conical geometry, a spherical geometry, an aspherical geometry, a rectangular geometry, a pyramidal geometry, or any arbitrary shape. The second recess distribution 664 may comprise recesses characterized by a second size (e.g., latitudinal dimension (or width), and/or longitudinal dimension (or depth)). The first size of the shelf in the first recess configuration 662 may or may not be the same as the second size of the recesses in the second recess configuration 664. For instance, the second size may be smaller than the first size.

As shown in FIGS. 8A and 8B, the resonator plate 650 comprises a dielectric plate having a plate diameter and a plate thickness. Therein, the plasma surface 660 on resonator plate 650 comprises a planar surface 666 within which the first recess configuration 662 and the second recess configuration 664 are formed. Alternatively, the resonator plate 650 comprises an arbitrary geometry. Therein, the plasma surface 660 may comprise a non-planar surface within which the first recess configuration and the second recess configuration are formed (not shown). For example, the non-planar surface may be concave, or convex, or a combination thereof.

The propagation of EM energy in the resonator plate 650 may be characterized by an effective wavelength ($\lambda$) for a given frequency of EM energy and dielectric constant for the resonator plate 650. The plate thickness may be an integer number of quarter wavelengths ($n\lambda/4$, where n is an integer greater than zero) or an integer number of half wavelengths ($m\lambda/2$, where m is an integer greater than zero). For instance, the plate thickness may be about half the effective wavelength ($\lambda/2$) or greater than half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 662 may comprise an annular shelf, wherein the annular shelf is characterized by a first shelf depth and a first shelf width (or a first inner shelf radius and first outer shelf radius). As shown in FIG. 8A, the first recess configuration 662 is located a peripheral edge of the plasma surface 660.

The first shelf width may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a first difference between the plate thickness and the first shelf depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the first shelf width may be about the effective wavelength ($\lambda$), and a first difference between the plate thickness and the first shelf depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the first shelf width may range from about 25 mm to about 75 mm, and the first difference between the plate thickness and the first shelf depth may range from about 10 mm to about 35 mm. Alternatively yet, the first shelf width may range from about 55 mm to about 65 mm, and the first difference may range from about 10 mm to about 20 mm. Alternatively yet, the first shelf width and/or the first shelf depth may be a fraction of the plate thickness.

In the first recess configuration 662, chamfers, rounds and/or fillets (i.e., surface/corner radius or bevel) may be utilized to affect smooth surface transitions between adjacent surfaces. In an annular shelf recess, a surface radius may be disposed at the corner between the cylindrical sidewall and the bottom of the recess. Additionally, in an annular shelf recess, a surface radius may be disposed at the corner between the cylindrical sidewall and the plasma surface 660. For example, the surface radius may range from about 1 mm to about 3 mm.

As another example, the second recess configuration 664 may comprise a second plurality of cylindrical recesses, each of the second plurality of cylindrical recesses being characterized by a second depth and a second diameter. As shown in FIG. 8A, the second recess configuration 664 is located near an inner region of the plasma surface 660. Although not shown, the second recess configuration 664 may comprise a second shelf, such as a second annular shelf that is characterized by a second shelf depth and a second shelf width (or second inner shelf radius and second outer shelf radius).

The second diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a second difference between the plate thickness and the second depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the second diameter may be about half the effective wavelength ($\lambda/2$) or about quarter the effective wavelength ($\lambda/4$), and a second difference between the plate thickness and the second depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the second diameter may range from about 25 mm (millimeters) to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or the second depth may be a fraction of the plate thickness.

In the second recess configuration 664, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, the recess, a surface radius may be disposed at the corner between the cylindrical sidewall and the plasma surface 660. For example, the surface radius may range from about 1 mm to about 3 mm.

The first plurality of slots 648 and the second plurality of slots 649 in the slot antenna are illustrated as if one can see through resonator plate 650 to the slot antenna. As shown in FIG. 8A, the first plurality of slots 648 and the second plurality of slots 649 may be arranged in pairs, wherein each of the pair of slots comprises a first slot oriented orthogonal to a second slot. However, the orientation of slots in the first plurality of slots 648 and the second plurality of slots 649 may be arbitrary. For example, the orientation of slots in the first plurality of slots 648 and the second plurality of slots 649 may be according to a pre-determined pattern for plasma uniformity and/or plasma stability.

The first recess configuration 662 is substantially aligned with the first plurality of slots 648. The second recess configuration 664 is either partly aligned with the second plurality of slots 649 or not aligned with the second plurality of slots 649. As shown in FIG. 8A, the second recess configuration 664 is partly aligned with the second plurality of slots 649, wherein the second recess configuration 664 possesses no direct overlap with a slot.

Figure 9A:
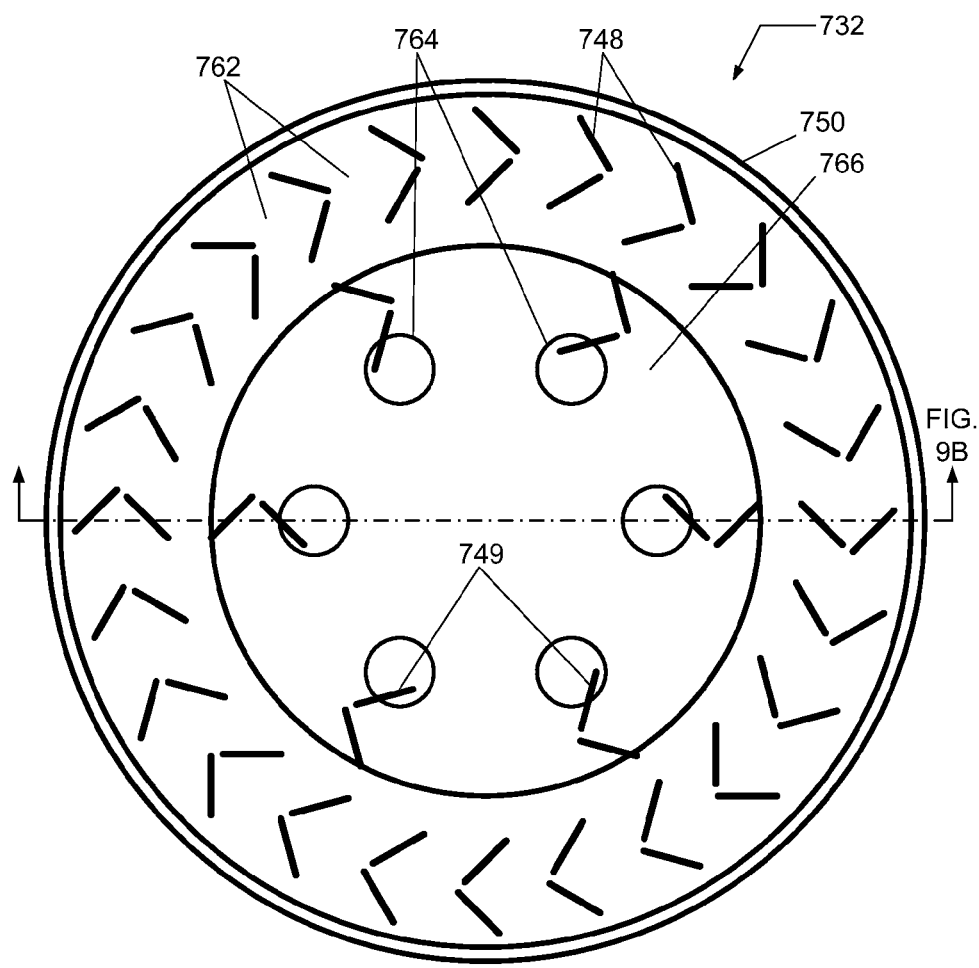
FIG. 9A provides a bottom view of an EM wave launcher according to another embodiment.
Figure 9B:
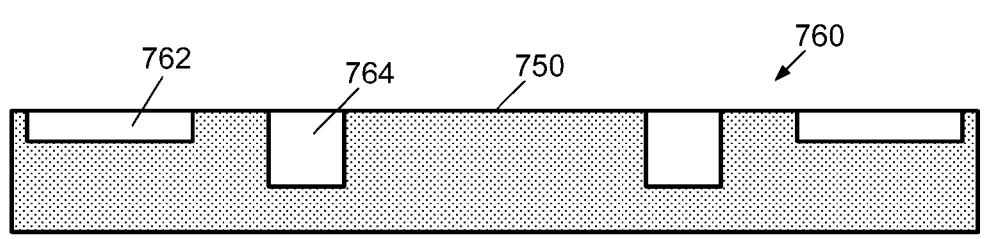
FIG. 9B presents a schematic cross-sectional view of a portion of the EM wave launcher depicted in FIG. 9A.

Referring now to FIGS. 9A and 9B, a bottom view and a schematic cross-sectional view, respectively, of EM wave launcher 732 are provided according to another embodiment. The EM wave launcher 732 comprises a resonator plate 750 with plasma surface 760. The EM wave launcher 732 further comprises a slot antenna having a first plurality of slots 748 and a second plurality of slots 749. The first plurality of slots 748 and the second plurality of slots 749 permit the coupling of EM energy from a first region above the slot antenna to a second region below the slot antenna wherein the resonator plate 750 is located.

The number, geometry, size, and distribution of the slots 748, 749 are all factors that can contribute to the spatial uniformity of the plasma formed in process space 115 (see FIG. 1A) or plasma space 116 (see FIG. 1B). Thus, the design of the slot antenna may be used to control the spatial uniformity of the plasma in process space 115 (see FIG. 1A) or plasma space 116 (see FIG. 1B).

Figure 9C:
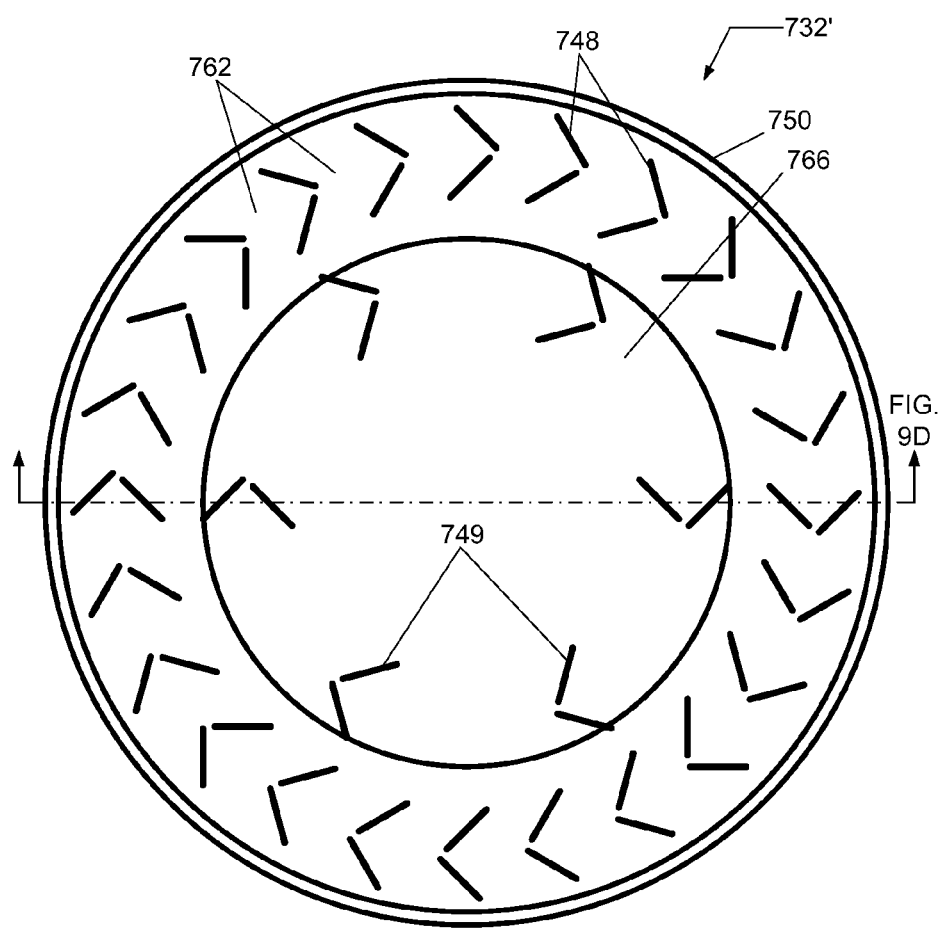
FIG. 9C provides a bottom view of an EM wave launcher according to another embodiment.
Figure 9D:
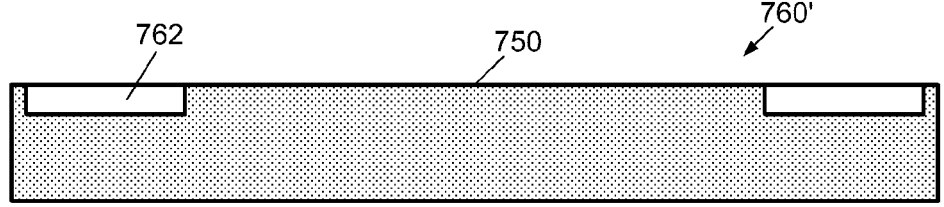
FIG. 9D presents a schematic cross-sectional view of a portion of the EM wave launcher depicted in FIG. 9C.

As shown in FIGS. 9A and 9B, the EM wave launcher 732 is fabricated with a first recess configuration 762 formed in the plasma surface 760 and a second recess configuration 764 formed in the plasma surface 760 according to one embodiment. However, in another embodiment, the second recess configuration 764 is excluded. As shown in FIGS. 9C and 9D, an EM wave launcher 732' is depicted having a plasma surface 760' that excludes the second recess configuration 764.

The first recess configuration 762 may comprise a channel. The channel in the first recess configuration 762 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The first recess distribution 762 may comprise a channel characterized by a first size (e.g., latitudinal dimension (or width), and/or longitudinal dimension (or depth)).

The second recess configuration 764 may comprise a plurality of recesses. Each recess in the second recess configuration 764 may comprise a unique indentation or dimple formed within the plasma surface 760. For example, a recess in the second recess configuration 764 may comprise a cylindrical geometry, a conical geometry, a frusto-conical geometry, a spherical geometry, an aspherical geometry, a rectangular geometry, a pyramidal geometry, or any arbitrary shape. The second recess distribution 764 may comprise recesses characterized by a second size (e.g., latitudinal dimension (or width), and/or longitudinal dimension (or depth)). The first size of the channel in the first recess configuration 762 may or may not be the same as the second size of the recesses in the second recess configuration 764. For instance, the second size may be smaller than the first size.

As shown in FIGS. 9A and 9B, the resonator plate 750 comprises a dielectric plate having a plate diameter and a plate thickness. Therein, the plasma surface 760 on resonator plate 750 comprises a planar surface 766 within which the first recess configuration 762 and the second recess configuration 764 are formed. Alternatively, the resonator plate 750 comprises an arbitrary geometry. Therein, the plasma surface 760 may comprise a non-planar surface within which the first recess configuration and the second recess configuration are formed (not shown). For example, the non-planar surface may be concave, or convex, or a combination thereof.

The propagation of EM energy in the resonator plate 750 may be characterized by an effective wavelength ($\lambda$) for a given frequency of EM energy and dielectric constant for the resonator plate 750. The plate thickness may be an integer number of quarter wavelengths ($n\lambda/4$, where n is an integer greater than zero) or an integer number of half wavelengths ($m\lambda/2$, where m is an integer greater than zero). For instance, the plate thickness may be about half the effective wavelength ($\lambda/2$) or greater than half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 762 may comprise an annular channel, wherein the annular channel is characterized by a first channel depth and a first channel width (or a first inner channel radius and first outer channel radius).

As shown in FIG. 9A, the first recess configuration 762 is located a peripheral edge of the plasma surface 760.

The first channel width may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a first difference between the plate thickness and the first channel depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the first channel width may be about the effective wavelength ($\lambda$), and a first difference between the plate thickness and the first channel depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the first channel width may range from about 25 mm to about 75 mm, and the first difference between the plate thickness and the first channel depth may range from about 10 mm to about 35 mm. Alternatively yet, the first channel width may range from about 55 mm to about 65 mm, and the first difference may range from about 10 mm to about 20 mm. Alternatively yet, the first channel width and/or the first channel depth may be a fraction of the plate thickness.

In the first recess configuration 762, chamfers, rounds and/or fillets (i.e., surface/corner radius or bevel) may be utilized to affect smooth surface transitions between adjacent surfaces. In an annular channel recess, a surface radius may be disposed at the corner between a cylindrical sidewall and the bottom of the recess. Additionally, in an annular channel recess, a surface radius may be disposed at the corner between a cylindrical sidewall and the plasma surface 760. For example, the surface radius may range from about 1 mm to about 3 mm.

As another example, the second recess configuration 764 may comprise a second plurality of cylindrical recesses, each of the second plurality of cylindrical recesses being characterized by a second depth and a second diameter. As shown in FIG. 9A, the second recess configuration 764 is located near an inner region of the plasma surface 760. Although not shown, the second recess configuration 764 may comprise a second channel, such as a second annular channel that is characterized by a second channel depth and a second channel width (or second inner channel radius and second outer channel radius).

The second diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a second difference between the plate thickness and the second depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the second diameter may be about half the effective wavelength ($\lambda/2$) or about quarter the effective wavelength ($\lambda/4$), and a second difference between the plate thickness and the second depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the second diameter may range from about 25 mm (millimeters) to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or the second depth may be a fraction of the plate thickness.

In the second recess configuration 764, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, the recess, a surface radius may be disposed at the corner between the cylindrical sidewall and the plasma surface 760. For example, the surface radius may range from about 1 mm to about 3 mm.

The first plurality of slots 748 and the second plurality of slots 749 in the slot antenna are illustrated as if one can see through resonator plate 750 to the slot antenna. As shown in FIG. 9A, the first plurality of slots 748 and the second plurality of slots 749 may be arranged in pairs, wherein each of the pair of slots comprises a first slot oriented orthogonal to a second slot. However, the orientation of slots in the first plurality of slots 748 and the second plurality of slots 749 may be arbitrary. For example, the orientation of slots in the first plurality of slots 748 and the second plurality of slots 749 may be according to a pre-determined pattern for plasma uniformity and/or plasma stability.

The first recess configuration 762 is substantially aligned with the first plurality of slots 748. The second recess configuration 764 is either partly aligned with the second plurality of slots 749 or not aligned with the second plurality of slots 749. As shown in FIG. 9A, the second recess configuration 764 is partially aligned with the second plurality of slots 749, wherein the second recess configuration 764 possesses a partial direct overlap with a slot.

Figure 9E:
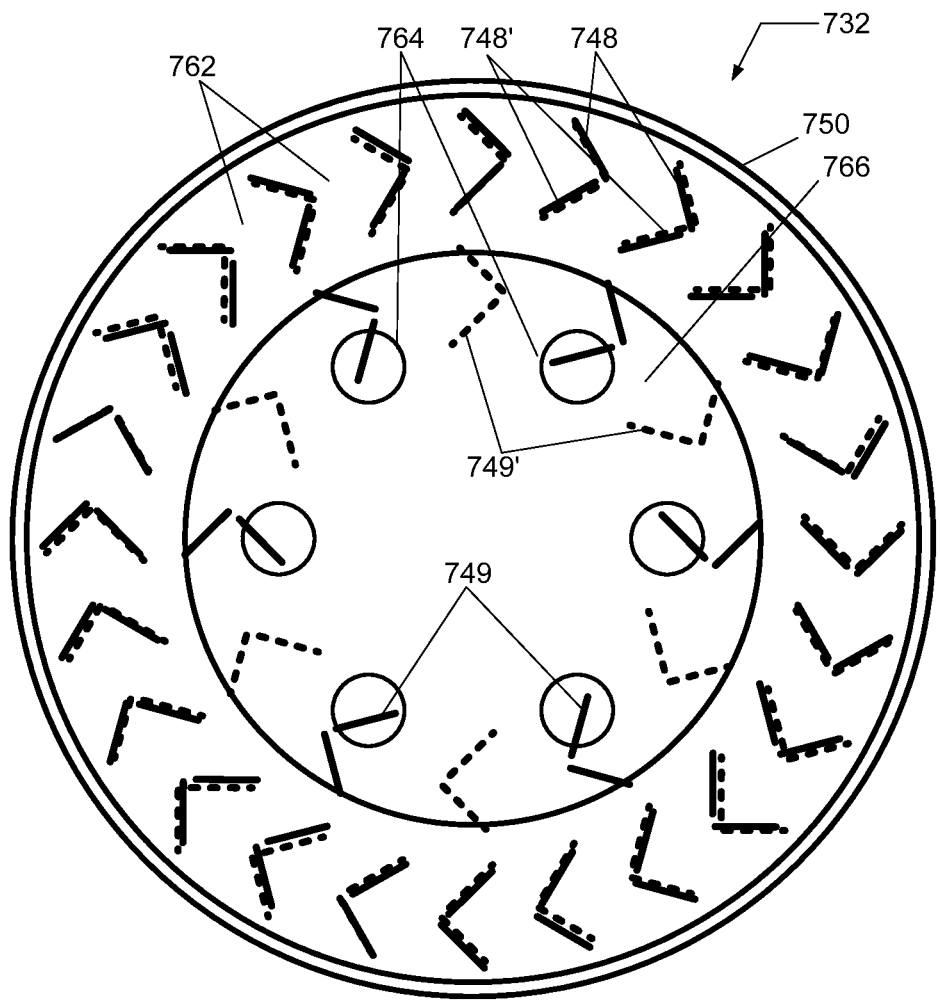
FIG. 9E provides a bottom view of an EM wave launcher according to another embodiment.

As shown in FIG. 9E, a bottom view of EM wave launcher 732 is provided, wherein the slot antenna has been rotated relative to the resonator plate 750. The original orientation of the slot antenna, including the first plurality of slots 748 and the second plurality of slots 749, is illustrated with solid lines. The rotated orientation of the slot antenna, including a first plurality of slots 748' and a second plurality of slots 749', is illustrated with dashed lines (the first plurality of slots 748' are shown to be slightly mis-aligned with the original arrangement of the first plurality of slots 748 for illustrative purposes). The orientation (i.e., rotation) of the slot antenna relative to the resonator plate 750, including the first recess configuration 762 and the second recess configuration 764, may be altered in order to adjust the plasma uniformity and/or plasma stability. For example, in the original arrangement, the first plurality of slots 748 aligns with the first recess configuration 762, and the second plurality of slots 749 aligns with the second recess configuration 764. Additionally, for example, in the rotated arrangement, the first plurality of slots 748' aligns with the first recess configuration 762', and the second plurality of slots 749' does not align with the second recess configuration 764.

Figure 10A:
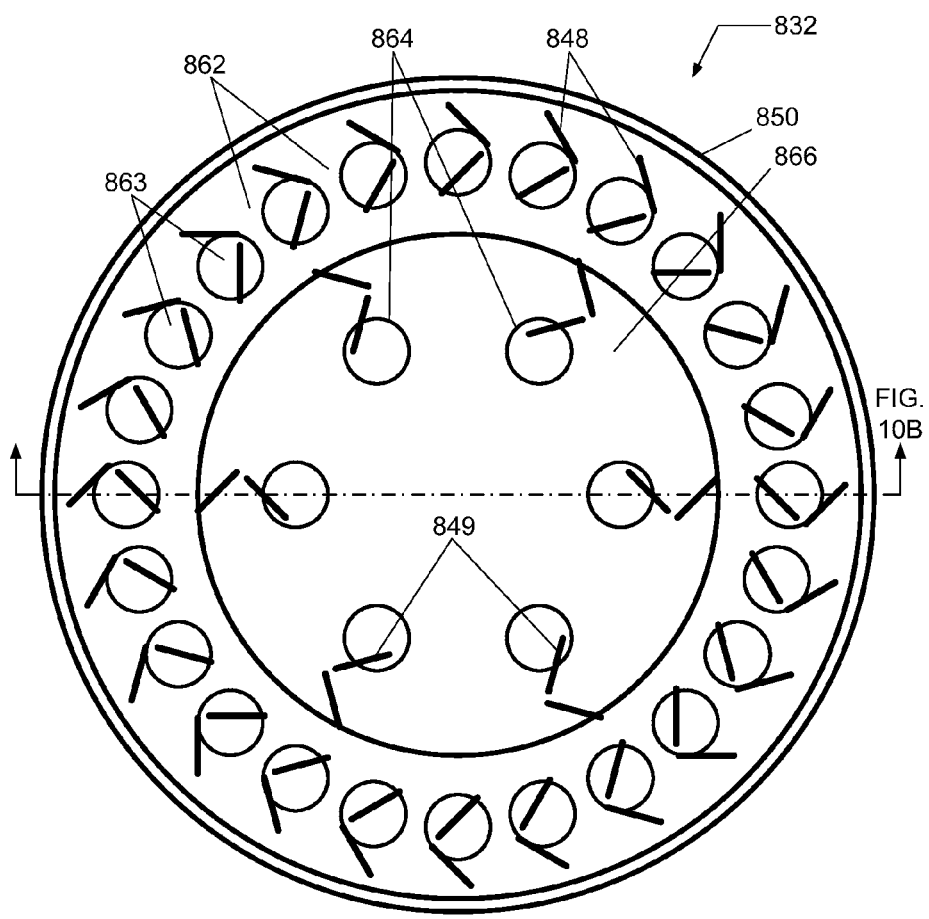
FIG. 10A provides a bottom view of an EM wave launcher according to another embodiment.
Figure 10B:
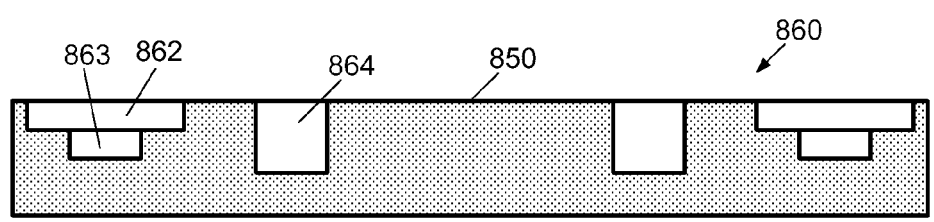
FIG. 10B presents a schematic cross-sectional view of a portion of the EM wave launcher depicted in FIG. 10A.

Referring now to FIGS. 10A and 10B, a bottom view and a schematic cross-sectional view, respectively, of EM wave launcher 832 are provided according to another embodiment. The EM wave launcher 832 comprises a resonator plate 850 with plasma surface 860. The EM wave launcher 832 further comprises a slot antenna having a first plurality of slots 848 and a second plurality of slots 849. The first plurality of slots 848 and the second plurality of slots 849 permit the coupling of EM energy from a first region above the slot antenna to a second region below the slot antenna wherein the resonator plate 850 is located.

The number, geometry, size, and distribution of the slots 848, 849 are all factors that can contribute to the spatial uniformity of the plasma formed in process space 115 (see FIG. 1A) or plasma space 116 (see FIG. 1B). Thus, the design of the slot antenna may be used to control the spatial uniformity of the plasma in process space 115 (see FIG. 1A) or plasma space 116 (see FIG. 1B).

As shown in FIGS. 10A and 10B, the EM wave launcher 832 is fabricated with a first recess configuration 862 formed in the plasma surface 860 and a second recess configuration 864 formed in the plasma surface 860 according to one embodiment.

The first recess configuration 862 may comprise a channel. The channel in the first recess configuration 862 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The first recess distribution 862 may comprise a channel characterized by a first size (e.g., latitudinal dimension (or width), and/or longitudinal dimension (or depth)).

The second recess configuration 864 may comprise a plurality of recesses. Each recess in the second recess configuration 864 may comprise a unique indentation or dimple formed within the plasma surface 860. For example, a recess in the second recess configuration 864 may comprise a cylindrical geometry, a conical geometry, a frusto-conical geometry, a spherical geometry, an aspherical geometry, a rectangular geometry, a pyramidal geometry, or any arbitrary shape. The second recess distribution 864 may comprise recesses characterized by a second size (e.g., latitudinal dimension (or width), and/or longitudinal dimension (or depth)). The first size of the channel in the first recess configuration 862 may or may not be the same as the second size of the recesses in the second recess configuration 864. For instance, the second size may be smaller than the first size.

As shown in FIGS. 10A and 10B, the resonator plate 850 comprises a dielectric plate having a plate diameter and a plate thickness. Therein, the plasma surface 860 on resonator plate 850 comprises a planar surface 866 within which the first recess configuration 862 and the second recess configuration 864 are formed. Alternatively, the resonator plate 850 comprises an arbitrary geometry. Therein, the plasma surface 860 may comprise a non-planar surface within which the first recess configuration and the second recess configuration are formed (not shown). For example, the non-planar surface may be concave, or convex, or a combination thereof.

The propagation of EM energy in the resonator plate 850 may be characterized by an effective wavelength ($\lambda$) for a given frequency of EM energy and dielectric constant for the resonator plate 850. The plate thickness may be an integer number of quarter wavelengths ($n\lambda/4$, where n is an integer greater than zero) or an integer number of half wavelengths ($m\lambda/2$, where m is an integer greater than zero). For instance, the plate thickness may be about half the effective wavelength ($\lambda/2$) or greater than half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 862 may comprise an annular channel, wherein the annular channel is characterized by a first channel depth and a first channel width (or a first inner channel radius and first outer channel radius). As shown in FIG. 10A, the first recess configuration 862 is located a peripheral edge of the plasma surface 860.

The first channel width may be an integer number of quarter wavelengths (nλ/4, where n is an integer greater than zero), or an integer number of half wavelengths (mλ/2, where m is an integer greater than zero), or a non-integral fraction of the effective wavelength. Additionally, a first difference between the plate thickness and the first channel depth may be an integer number of quarter wavelengths (nλ/4, where n is an integer greater than zero), or an integer number of half wavelengths (mλ/2, where m is an integer greater than zero), or a non-integral fraction of the effective wavelength. For instance, the first channel width may be about the effective wavelength (λ), and a first difference between the plate thickness and the first channel depth may be about half the effective wavelength (λ/2) or about quarter the effective wavelength (λ/4). Additionally, for instance, the plate thickness may be about half the effective wavelength (λ/2) or greater than half the effective wavelength (>λ/2).

Alternatively, the first channel width may range from about 25 mm to about 75 mm, and the first difference between the plate thickness and the first channel depth may range from about 10 mm to about 35 mm. Alternatively yet, the first channel width may range from about 55 mm to about 65 mm, and the first difference may range from about 10 mm to about 20 mm. Alternatively yet, the first channel width and/or the first channel depth may be a fraction of the plate thickness.

Additionally, the first recess configuration 862 may comprise a third plurality of cylindrical recesses 863 formed at a bottom of the first annular channel, wherein each of the third plurality of cylindrical recesses may be characterized by a third depth and a third diameter. Alternatively, the annular channel may be an annular shelf within which the third plurality of cylindrical recesses is formed at a bottom of the annular shelf. Alternatively yet, the first recess configuration 862 may comprise a third channel formed at a bottom of the first annular channel, wherein the third channel may be characterized by a third channel depth and a third channel width.

The third diameter may be an integer number of quarter wavelengths (nλ/4, where n is an integer greater than zero), or an integer number of half wavelengths (mλ/2, where m is an integer greater than zero), or a non-integral fraction of the effective wavelength. Additionally, a third difference between the plate thickness and the third depth may be an integer number of quarter wavelengths (nλ/4, where n is an integer greater than zero), or an integer number of half wavelengths (mλ/2, where m is an integer greater than zero), or a non-integral fraction of the effective wavelength. For instance, the third diameter may be about half the effective wavelength (λ/2) or about quarter the effective wavelength (λ/4), and a third difference between the plate thickness and the third depth may be about half the effective wavelength (λ/2) or about quarter the effective wavelength (λ/4). Additionally, for instance, the plate thickness may be about half the effective wavelength (λ/2) or greater than half the effective wavelength (>λ/2).

Alternatively, the third diameter may range from about 25 mm to about 75 mm, and the third difference between the plate thickness and the third depth may range from about 10 mm to about 35 mm. Alternatively yet, the third diameter may range from about 55 mm to about 65 mm, and the third difference may range from about 10 mm to about 20 mm. Alternatively yet, the third diameter width and/or the third depth may be a fraction of the plate thickness.

In the first recess configuration 862, chamfers, rounds and/or fillets (i.e., surface/corner radius or bevel) may be utilized to affect smooth surface transitions between adjacent surfaces. In an annular channel recess or cylindrical recess, a surface radius may be disposed at the corner between a cylindrical sidewall and the bottom of the recess. Additionally, in an annular channel recess or cylindrical recess, a surface radius may be disposed at the corner between a cylindrical sidewall and the plasma surface 860. For example, the surface radius may range from about 1 mm to about 3 mm.

As another example, the second recess configuration 864 may comprise a second plurality of cylindrical recesses, each of the second plurality of cylindrical recesses being characterized by a second depth and a second diameter. As shown in FIG. 10A, the second recess configuration 864 is located near an inner region of the plasma surface 860. Although not shown, the second recess configuration 864 may comprise a second channel, such as a second annular channel that is characterized by a second channel depth and a second channel width (or second inner channel radius and second outer channel radius).

The second diameter may be an integer number of quarter wavelengths (nλ/4, where n is an integer greater than zero), or an integer number of half wavelengths (mλ/2, where m is an integer greater than zero), or a non-integral fraction of the effective wavelength. Additionally, a second difference between the plate thickness and the second depth may be an integer number of quarter wavelengths (nλ/4, where n is an integer greater than zero), or an integer number of half wavelengths (mλ/2, where m is an integer greater than zero), or a non-integral fraction of the effective wavelength. For instance, the second diameter may be about half the effective wavelength (λ/2) or about quarter the effective wavelength (λ/4), and a second difference between the plate thickness and the second depth may be about half the effective wavelength (λ/2) or about quarter the effective wavelength (λ/4). Additionally, for instance, the plate thickness may be about half the effective wavelength (λ/2) or greater than half the effective wavelength (>λ/2).

Alternatively, the second diameter may range from about 25 mm (millimeters) to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or the second depth may be a fraction of the plate thickness.

In the second recess configuration 864, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, the recess, a surface radius may be disposed at the corner between the cylindrical sidewall and the plasma surface 860. For example, the surface radius may range from about 1 mm to about 3 mm.

The first plurality of slots 848 and the second plurality of slots 849 in the slot antenna are illustrated as if one can see through resonator plate 850 to the slot antenna. As shown in FIG. 10A, the first plurality of slots 848 and the second plurality of slots 849 may be arranged in pairs, wherein each of the pair of slots comprises a first slot oriented orthogonal to a second slot. However, the orientation of slots in the first plurality of slots 848 and the second plurality of slots 849 may be arbitrary. For example, the orientation of slots in the first plurality of slots 848 and the second plurality of slots 849 may be according to a pre-determined pattern for plasma uniformity and/or plasma stability.

The first recess configuration 862 is substantially aligned with the first plurality of slots 848. The second recess configuration 864 is either partly aligned with the second plurality of slots 849 or not aligned with the second plurality of slots 849. As shown in FIG. 10A, the second recess configuration 864 is partly aligned with the second plurality of slots 849, wherein the second recess configuration 864 possesses a partial direct overlap with a slot.

Figure 11A:
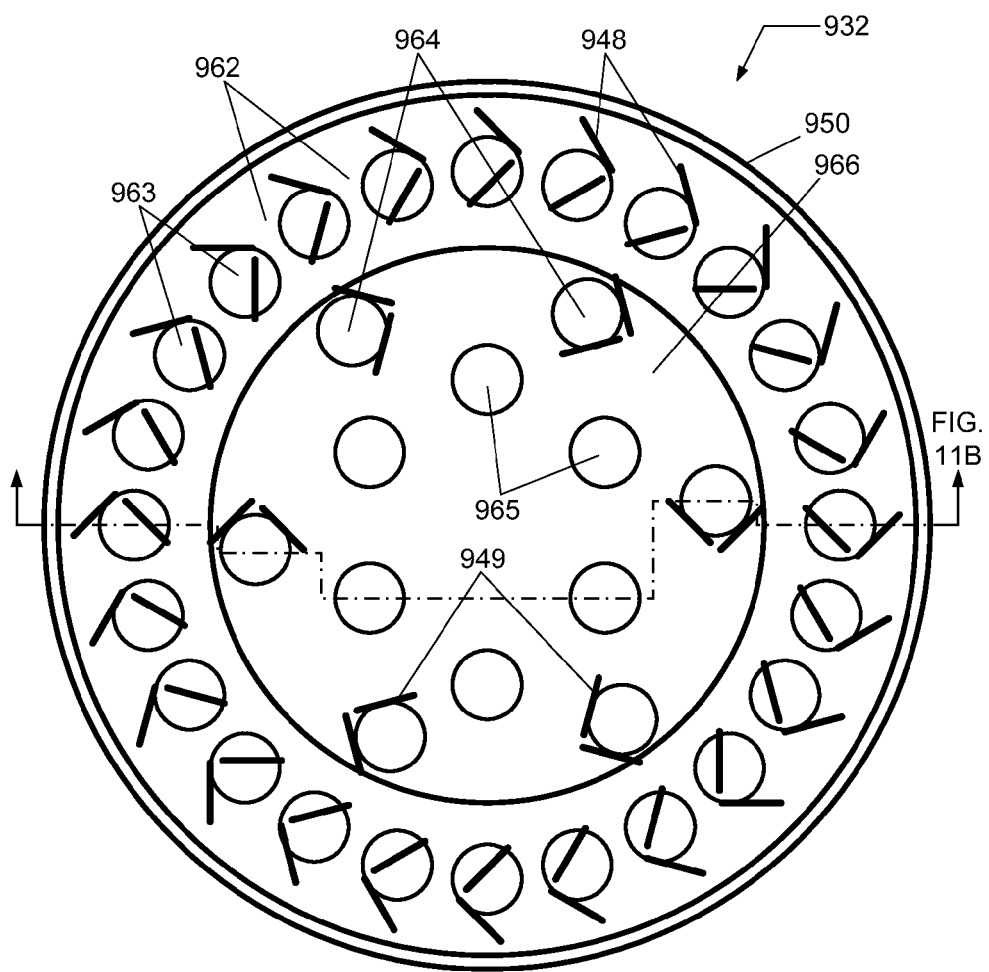
FIG. 11A provides a bottom view of an EM wave launcher according to another embodiment.
Figure 11B:
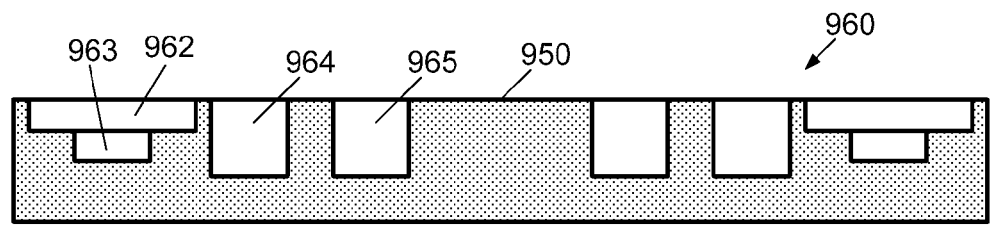
FIG. 11B presents a schematic cross-sectional view of a portion of the EM wave launcher depicted in FIG. 11A.

Referring now to FIGS. 11A and 11B, a bottom view and a schematic cross-sectional view, respectively, of EM wave launcher 932 are provided according to another embodiment. The EM wave launcher 932 comprises a resonator plate 950 with plasma surface 960. The EM wave launcher 932 further comprises a slot antenna having a first plurality of slots 948 and a second plurality of slots 949. The first plurality of slots 948 and the second plurality of slots 949 permit the coupling of EM energy from a first region above the slot antenna to a second region below the slot antenna wherein the resonator plate 950 is located.

The number, geometry, size, and distribution of the slots 948, 949 are all factors that can contribute to the spatial uniformity of the plasma formed in process space 115 (see FIG. 1A) or plasma space 116 (see FIG. 1B). Thus, the design of the slot antenna may be used to control the spatial uniformity of the plasma in process space 115 (see FIG. 1A) or plasma space 116 (see FIG. 1B).

As shown in FIGS. 11A and 11B, the EM wave launcher 932 is fabricated with a first recess configuration 962 formed in the plasma surface 960, a second recess configuration 964 formed in the plasma surface 960, and a third recess configuration 965 formed in the plasma surface 960 according to one embodiment.

The first recess configuration 962 may comprise a channel. The channel in the first recess configuration 962 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The first recess distribution 962 may comprise a channel characterized by a first size (e.g., latitudinal dimension (or width), and/or longitudinal dimension (or depth)).

The second recess configuration 964 may comprise a plurality of recesses. Each recess in the second recess configuration 964 may comprise a unique indentation or dimple formed within the plasma surface 960. For example, a recess in the second recess configuration 964 may comprise a cylindrical geometry, a conical geometry, a frusto-conical geometry, a spherical geometry, an aspherical geometry, a rectangular geometry, a pyramidal geometry, or any arbitrary shape. The second recess distribution 964 may comprise recesses characterized by a second size (e.g., latitudinal dimension (or width), and/or longitudinal dimension (or depth)). The first size of the channel in the first recess configuration 962 may or may not be the same as the second size of the recesses in the second recess configuration 964. For instance, the second size may be smaller than the first size.

The third recess configuration 965 may comprise a plurality of recesses. Each recess in the third recess configuration 965 may comprise a unique indentation or dimple formed within the plasma surface 960. For example, a recess in the third recess configuration 965 may comprise a cylindrical geometry, a conical geometry, a frusto-conical geometry, a spherical geometry, an aspherical geometry, a rectangular geometry, a pyramidal geometry, or any arbitrary shape. The third recess distribution 965 may comprise recesses characterized by a third size (e.g., latitudinal dimension (or width), and/or longitudinal dimension (or depth)). The first size of the channel in the first recess configuration 962 may or may not be the same as the third size of the recesses in the third recess configuration 965. For instance, the third size may be smaller than the first size and/or second size.

As shown in FIGS. 11A and 11B, the resonator plate 950 comprises a dielectric plate having a plate diameter and a plate thickness. Therein, the plasma surface 960 on resonator plate 950 comprises a planar surface 966 within which the first recess configuration 962, the second recess configuration 964, and the third recess configuration 965 are formed. Alternatively, the resonator plate 950 comprises an arbitrary geometry. Therein, the plasma surface 960 may comprise a non-planar surface within which the first recess configuration and the second recess configuration are formed (not shown). For example, the non-planar surface may be concave, or convex, or a combination thereof.

The propagation of EM energy in the resonator plate 950 may be characterized by an effective wavelength ($\lambda$) for a given frequency of EM energy and dielectric constant for the resonator plate 950. The plate thickness may be an integer number of quarter wavelengths ($n\lambda/4$, where n is an integer greater than zero) or an integer number of half wavelengths ($m\lambda/2$, where m is an integer greater than zero). For instance, the plate thickness may be about half the effective wavelength ($\lambda/2$) or greater than half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 962 may comprise an annular channel, wherein the annular channel is characterized by a first channel depth and a first channel width (or a first inner channel radius and first outer channel radius). As shown in FIG. 11A, the first recess configuration 962 is located a peripheral edge of the plasma surface 960.

The first channel width may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a first difference between the plate thickness and the first channel depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the first channel width may be about the effective wavelength ($\lambda$), and a first difference between the plate thickness and the first channel depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the first channel width may range from about 25 mm to about 75 mm, and the first difference between the plate thickness and the first channel depth may range from about 10 mm to about 35 mm. Alternatively yet, the first channel width may range from about 55 mm to about 65 mm, and the first difference may range from about 10 mm to about 20 mm. Alternatively yet, the first channel width and/or the first channel depth may be a fraction of the plate thickness.

Additionally, the first recess configuration 962 may comprise a fourth plurality of cylindrical recesses 963 formed at a bottom of the first annular channel, wherein each of the fourth plurality of cylindrical recesses may be characterized by a fourth depth and a fourth diameter. Alternatively, the annular channel may be an annular shelf within which the fourth plurality of cylindrical recesses is formed at a bottom of the annular shelf. Alternatively yet, the first recess configuration 962 may comprise a fourth channel formed at a bottom of the first annular channel, wherein the fourth channel may be characterized by a fourth channel depth and a fourth channel width.

The fourth diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a fourth difference between the plate thickness and the fourth depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the fourth diameter may be about half the effective wavelength ($\lambda/2$) or about quarter the effective wavelength ($\lambda/4$), and a fourth difference between the plate thickness and the fourth depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the fourth diameter may range from about 25 mm to about 75 mm, and the fourth difference between the plate thickness and the fourth depth may range from about 10 mm to about 35 mm. Alternatively yet, the fourth diameter may range from about 55 mm to about 65 mm, and the fourth difference may range from about 10 mm to about 20 mm. Alternatively yet, the fourth diameter and/or the fourth depth may be a fraction of the plate thickness.

In the first recess configuration 962, chamfers, rounds and/or fillets (i.e., surface/corner radius or bevel) may be utilized to affect smooth surface transitions between adjacent surfaces. In an annular channel recess or cylindrical recess, a surface radius may be disposed at the corner between a cylindrical sidewall and the bottom of the recess. Additionally, in an annular channel recess or cylindrical recess, a surface radius may be disposed at the corner between a cylindrical sidewall and the plasma surface 960. For example, the surface radius may range from about 1 mm to about 3 mm.

As another example, the second recess configuration 964 may comprise a second plurality of cylindrical recesses, each of the second plurality of cylindrical recesses being characterized by a second depth and a second diameter. As shown in FIG. 11A, the second recess configuration 964 is located near an inner region of the plasma surface 960. Although not shown, the second recess configuration 964 may comprise a second channel, such as a second annular channel that is characterized by a second channel depth and a second channel width (or second inner channel radius and second outer channel radius).

The second diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a second difference between the plate thickness and the second depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the second diameter may be about half the effective wavelength ($\lambda/2$) or about quarter the effective wavelength ($\lambda/4$), and a second difference between the plate thickness and the second depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the second diameter may range from about 25 mm (millimeters) to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or the second depth may be a fraction of the plate thickness.

In the second recess configuration 964, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, the recess, a surface radius may be disposed at the corner between the cylindrical sidewall and the plasma surface 960. For example, the surface radius may range from about 1 mm to about 3 mm.

As yet another example, the third recess configuration 965 may comprise a third plurality of cylindrical recesses, each of the third plurality of cylindrical recesses being characterized by a third depth and a third diameter. As shown in FIG. 11A, the third recess configuration 965 is located near an inner region of the plasma surface 960. Although not shown, the third recess configuration 965 may comprise a third channel, such as a third annular channel that is characterized by a third channel depth and a third channel width (or third inner channel radius and third outer channel radius).

The third diameter may be an integer number of quarter wavelengths ($n\lambda/4$, where n is an integer greater than zero), or an integer number of half wavelengths ($m\lambda/2$, where m is an integer greater than zero), or non-integral fraction of the effective wavelength. Additionally, a third difference between the plate thickness and the third depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the third diameter may be about half the effective wavelength ($\lambda/2$) or about quarter the effective wavelength ($\lambda/4$), and a third difference between the plate thickness and the third depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the third diameter may range from about 25 mm (millimeters) to about 35 mm, and the third difference between the plate thickness and the third depth may range from about 10 mm to about 35 mm. Alternatively yet, the third diameter may range from about 30 mm to about 35 mm, and the third difference may range from about 10 mm to about 20 mm. Alternatively yet, the third diameter and/or the third depth may be a fraction of the plate thickness.

In the third recess configuration 965, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, the recess, a surface radius may be disposed at the corner between the cylindrical sidewall and the plasma surface 960. For example, the surface radius may range from about 1 mm to about 3 mm.

The first plurality of slots 948 and the second plurality of slots 949 in the slot antenna are illustrated as if one can see through resonator plate 950 to the slot antenna. As shown in FIG. 11A, the first plurality of slots 948 and the second plurality of slots 949 may be arranged in pairs, wherein each of the pair of slots comprises a first slot oriented orthogonal to a second slot. However, the orientation of slots in the first plurality of slots 948 and the second plurality of slots 949 may be arbitrary. For example, the orientation of slots in the first plurality of slots 948 and the second plurality of slots 949 may be according to a pre-determined pattern for plasma uniformity and/or plasma stability.

The first recess configuration 962 is substantially aligned with the first plurality of slots 948. The second recess configuration 964 is either partly aligned with the second plurality of slots 949 or not aligned with the second plurality of slots 949. The third recess configuration 965 is not aligned with the first plurality of slots 948 or the second plurality of slots 949. As shown in FIG. 11A, the second recess configuration 964 is partly aligned with the second plurality of slots 949, wherein the second recess configuration 964 possesses no direct overlap with a slot.

Figure 11C:
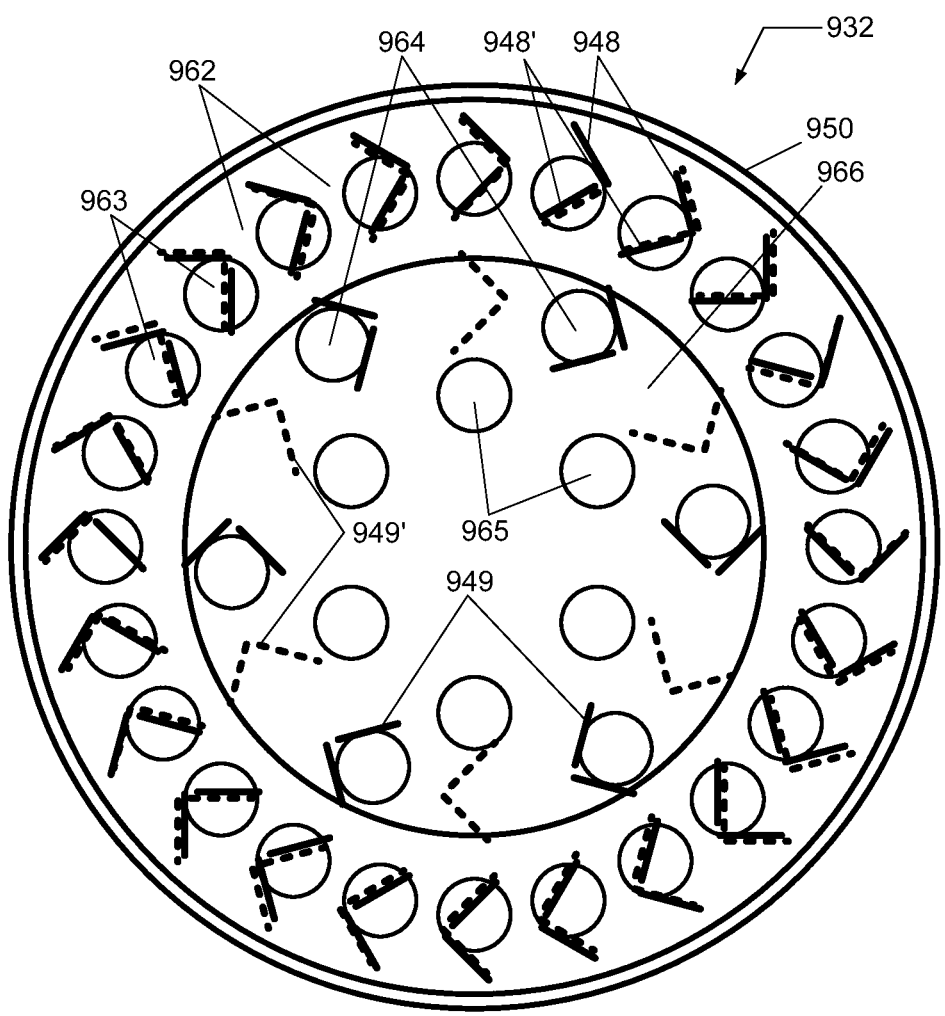
FIG. 11C provides a bottom view of an EM wave launcher according to another embodiment.

As shown in FIG. 11C, a bottom view of EM wave launcher 932 is provided, wherein the slot antenna has been rotated relative to the resonator plate 950. The original orientation of the slot antenna, including the first plurality of slots 948 and the second plurality of slots 949, is illustrated with solid lines. The rotated orientation of the slot antenna, including a first plurality of slots 948' and a second plurality of slots 949', is illustrated with dashed lines (the first plurality of slots 948' are shown to be slightly mis-aligned with the original arrangement of the first plurality of slots 948 for illustrative purposes). The orientation (i.e., rotation) of the slot antenna relative to the resonator plate 950, including the first recess configuration 962, the second recess configuration 964, and the third recess configuration 965, may be altered in order to adjust the plasma uniformity and/or plasma stability. For example, in the original arrangement, the first plurality of slots 948 aligns with the first recess configuration 962, and the second plurality of slots 949 partly aligns with the second recess configuration 964. Additionally, for example, in the rotated arrangement, the first plurality of slots 948' aligns with the first recess configuration 962', and the second plurality of slots 949' does not align with the second recess configuration 964.

Figure 12A:
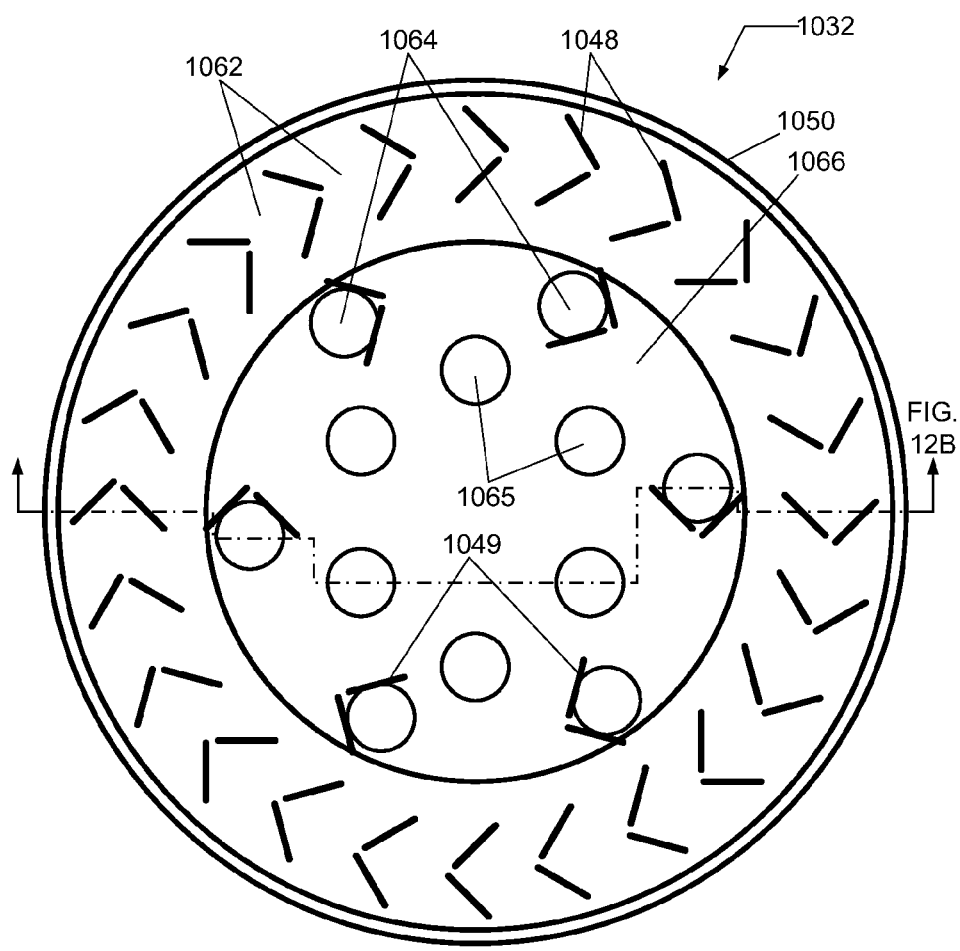
FIG. 12A provides a bottom view of an EM wave launcher according to another embodiment.
Figure 12B:
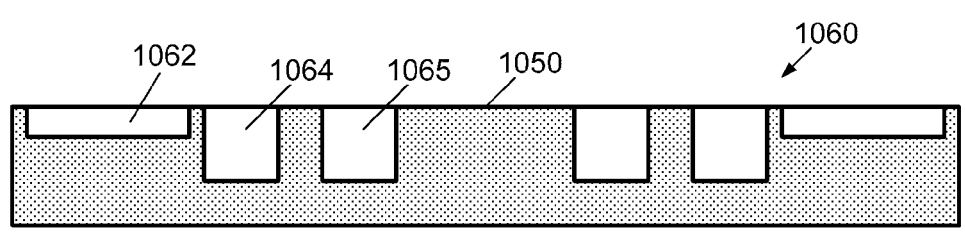
FIG. 12B presents a schematic cross-sectional view of a portion of the EM wave launcher depicted in FIG. 12A.

Referring now to FIGS. 12A and 12B, a bottom view and a schematic cross-sectional view, respectively, of EM wave launcher 1032 are provided according to another embodiment. The EM wave launcher 1032 comprises a resonator plate 1050 with plasma surface 1060. The EM wave launcher 1032 further comprises a slot antenna having a first plurality of slots 1048 and a second plurality of slots 1049. The first plurality of slots 1048 and the second plurality of slots 1049 permit the coupling of EM energy from a first region above the slot antenna to a second region below the slot antenna wherein the resonator plate 1050 is located.

The number, geometry, size, and distribution of the slots 1048, 1049 are all factors that can contribute to the spatial uniformity of the plasma formed in process space 115 (see FIG. 1A) or plasma space 116 (see FIG. 1B). Thus, the design of the slot antenna may be used to control the spatial uniformity of the plasma in process space 115 (see FIG. 1A) or plasma space 116 (see FIG. 1B).

As shown in FIGS. 12A and 12B, the EM wave launcher 1032 is fabricated with a first recess configuration 1062 formed in the plasma surface 1060, a second recess configuration 1064 formed in the plasma surface 1060, and a third recess configuration 1065 formed in the plasma surface 1060 according to one embodiment.

The first recess configuration 1062 may comprise a channel. The channel in the first recess configuration 1062 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The first recess distribution 1062 may comprise a channel characterized by a first size (e.g., latitudinal dimension (or width), and/or longitudinal dimension (or depth)).

The second recess configuration 1064 may comprise a plurality of recesses. Each recess in the second recess configuration 1064 may comprise a unique indentation or dimple formed within the plasma surface 1060. For example, a recess in the second recess configuration 1064 may comprise a cylindrical geometry, a conical geometry, a frusto-conical geometry, a spherical geometry, an aspherical geometry, a rectangular geometry, a pyramidal geometry, or any arbitrary shape. The second recess distribution 1064 may comprise recesses characterized by a second size (e.g., latitudinal dimension (or width), and/or longitudinal dimension (or depth)). The first size of the channel in the first recess configuration 1062 may or may not be the same as the second size of the recesses in the second recess configuration 1064. For instance, the second size may be smaller than the first size.

The third recess configuration 1065 may comprise a plurality of recesses. Each recess in the third recess configuration 1065 may comprise a unique indentation or dimple formed within the plasma surface 1060. For example, a recess in the third recess configuration 1065 may comprise a cylindrical geometry, a conical geometry, a frusto-conical geometry, a spherical geometry, an aspherical geometry, a rectangular geometry, a pyramidal geometry, or any arbitrary shape. The third recess distribution 1065 may comprise recesses characterized by a third size (e.g., latitudinal dimension (or width), and/or longitudinal dimension (or depth)). The first size of the channel in the first recess configuration 1062 may or may not be the same as the third size of the recesses in the third recess configuration 1065. For instance, the third size may be smaller than the first size and/or second size.

As shown in FIGS. 12A and 12B, the resonator plate 1050 comprises a dielectric plate having a plate diameter and a plate thickness. Therein, the plasma surface 1060 on resonator plate 1050 comprises a planar surface 1066 within which the first recess configuration 1062, the second recess configuration 1064, and the third recess configuration 1065 are formed. Alternatively, the resonator plate 1050 comprises an arbitrary geometry. Therein, the plasma surface 1060 may comprise a non-planar surface within which the first recess configuration and the second recess configuration are formed (not shown). For example, the non-planar surface may be concave, or convex, or a combination thereof.

The propagation of EM energy in the resonator plate 1050 may be characterized by an effective wavelength ($\lambda$) for a given frequency of EM energy and dielectric constant for the resonator plate 1050. The plate thickness may be an integer number of quarter wavelengths ($n\lambda/4$, where n is an integer greater than zero) or an integer number of half wavelengths ($m\lambda/2$, where m is an integer greater than zero). For instance, the plate thickness may be about half the effective wavelength ($\lambda/2$) or greater than half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 1062 may comprise an annular channel, wherein the annular channel is characterized by a first channel depth and a first channel width (or a first inner channel radius and first outer channel radius). As shown in FIG. 11A, the first recess configuration 1062 is located a peripheral edge of the plasma surface 1060.

The first channel width may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a first difference between the plate thickness and the first channel depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the first channel width may be about the effective wavelength ($\lambda$), and a first difference between the plate thickness and the first channel depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the first channel width may range from about 25 mm to about 75 mm, and the first difference between the plate thickness and the first channel depth may range from about 10 mm to about 35 mm. Alternatively yet, the first channel width may range from about 55 mm to about 65 mm, and the first difference may range from about 10 mm to about 20 mm. Alternatively yet, the first channel width and/or the first channel depth may be a fraction of the plate thickness.

In the first recess configuration 1062, chamfers, rounds and/or fillets (i.e., surface/corner radius or bevel) may be utilized to affect smooth surface transitions between adjacent surfaces. In an annular channel recess, a surface radius may be disposed at the corner between a cylindrical sidewall and the bottom of the recess. Additionally, in an annular channel recess, a surface radius may be disposed at the corner between a cylindrical sidewall and the plasma surface 960. For example, the surface radius may range from about 1 mm to about 3 mm.

As another example, the second recess configuration 1064 may comprise a second plurality of cylindrical recesses, each of the second plurality of cylindrical recesses being characterized by a second depth and a second diameter. As shown in FIG. 12A, the second recess configuration 1064 is located near an inner region of the plasma surface 1060. Although not shown, the second recess configuration 1064 may comprise a second channel, such as a second annular channel that is characterized by a second channel depth and a second channel width (or second inner channel radius and second outer channel radius).

The second diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a second difference between the plate thickness and the second depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the second diameter may be about half the effective wavelength ($\lambda/2$) or about quarter the effective wavelength ($\lambda/4$), and a second difference between the plate thickness and the second depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the second diameter may range from about 25 mm (millimeters) to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or the second depth may be a fraction of the plate thickness.

In the second recess configuration 1064, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, the recess, a surface radius may be disposed at the corner between the cylindrical sidewall and the plasma surface 1060. For example, the surface radius may range from about 1 mm to about 3 mm.

As yet another example, the third recess configuration 1065 may comprise a third plurality of cylindrical recesses, each of the third plurality of cylindrical recesses being characterized by a third depth and a third diameter. As shown in FIG. 12A, the third recess configuration 1065 is located near an inner region of the plasma surface 1060. Although not shown, the third recess configuration 1065 may comprise a third channel, such as a third annular channel that is characterized by a third channel depth and a third channel width (or third inner channel radius and third outer channel radius).

The third diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a third difference between the plate thickness and the third depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the third diameter may be about half the effective wavelength ($\lambda/2$) or about quarter the effective wavelength ($\lambda/4$), and a third difference between the plate thickness and the third depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the third diameter may range from about 25 mm (millimeters) to about 35 mm, and the third difference between the plate thickness and the third depth may range from about 10 mm to about 35 mm. Alternatively yet, the third diameter may range from about 30 mm to about 35 mm, and the third difference may range from about 10 mm to about 20 mm. Alternatively yet, the third diameter and/or the third depth may be a fraction of the plate thickness.

In the third recess configuration 1065, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, the recess, a surface radius may be disposed at the corner between the cylindrical sidewall and the plasma surface 1060. For example, the surface radius may range from about 1 mm to about 3 mm.

The first plurality of slots 1048 and the second plurality of slots 1049 in the slot antenna are illustrated as if one can see through resonator plate 1050 to the slot antenna. As shown in FIG. 12A, the first plurality of slots 1048 and the second plurality of slots 1049 may be arranged in pairs, wherein each of the pair of slots comprises a first slot oriented orthogonal to a second slot. However, the orientation of slots in the first plurality of slots 1048 and the second plurality of slots 1049 may be arbitrary. For example, the orientation of slots in the first plurality of slots 1048 and the second plurality of slots 1049 may be according to a pre-determined pattern for plasma uniformity and/or plasma stability.

The first recess configuration 1062 is substantially aligned with the first plurality of slots 1048. The second recess configuration 1064 is either partly aligned with the second plurality of slots 1049 or not aligned with the second plurality of slots 1049. The third recess configuration 1065 is not aligned with the first plurality of slots 1048 or the second plurality of slots 1049. As shown in FIG. 12A, the second recess configuration 1064 is partly aligned with the second plurality of slots 1049, wherein the second recess configuration 1064 possesses no direct overlap with a slot.

Figure 13A:
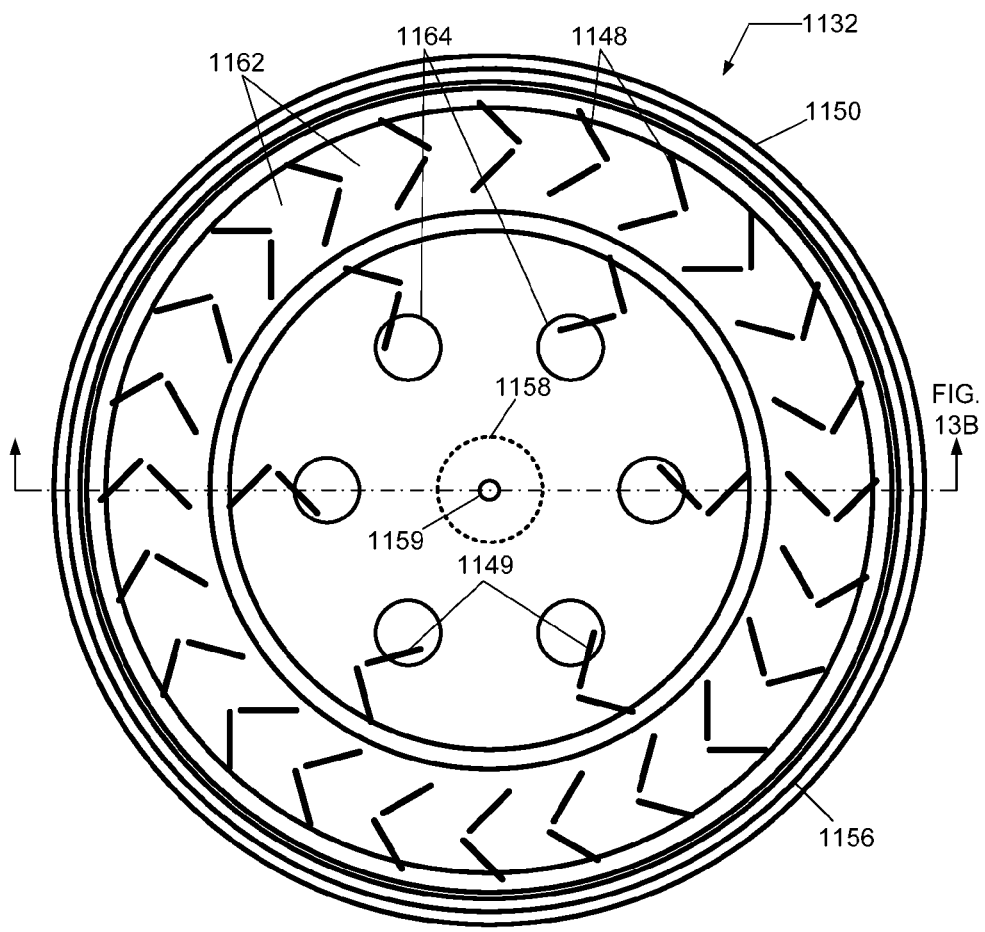
FIG. 13A provides a bottom view of an EM wave launcher according to yet another embodiment.
Figure 13B:
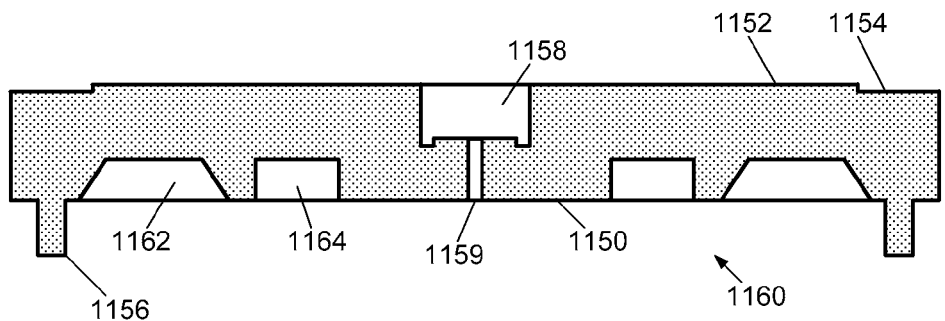
FIG. 13B presents a schematic cross-sectional view of a portion of an EM wave launcher depicted in FIG. 13A.

Referring now to FIGS. 13A and 13B, a schematic cross-sectional view of an EM wave launcher 1132 is provided according to yet another embodiment. The EM wave launcher comprises a resonator plate 1150 with plasma surface 1160. The EM wave launcher further comprises a slot antenna having a first plurality of slots 1148 and optionally a second plurality of slots 1149. The first plurality of slots 1148 and the second plurality of slots 1149 permit the coupling of EM energy from a first region above the slot antenna to a second region below the slot antenna wherein the resonator plate 1150 is located.

As shown in FIGS. 13A and 13B, the EM wave launcher 1132 is fabricated with a first recess configuration 1162 formed in the plasma surface 1160 and a second recess configuration 1164 formed in the plasma surface 1160 according to one embodiment.

The first recess configuration 1162 may comprise a channel having a trapezoidal or frusto-triangular cross-section. However, the channel in the first recess configuration 1162 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The first recess distribution 1162 may comprise a channel characterized by a first size (e.g., latitudinal dimension (or width), and/or longitudinal dimension (or depth)).

The second recess configuration 1164 may comprise a plurality of recesses. Each recess in the second recess configuration 1164 may comprise a unique indentation or dimple formed within the plasma surface 1160. For example, a recess in the second recess configuration 1164 may comprise a cylindrical geometry (as shown), a conical geometry, a frusto-conical geometry, a spherical geometry, an aspherical geometry, a rectangular geometry, a pyramidal geometry, or any arbitrary shape. The second recess distribution 1164 may comprise recesses characterized by a second size (e.g., latitudinal dimension (or width), and/or longitudinal dimension (or depth)). The first size of the channel in the first recess configuration 1162 may or may not be the same as the second size of the recesses in the second recess configuration 1164. For instance, the second size may be smaller than the first size.

A recess in any one of the recess configurations described in the embodiments of FIGS. 3 through 12B may have any one of the cross-sectional shapes illustrated in FIGS. 13A and 13B.

Additionally, as shown in FIGS. 13A and 13B, the EM wave launcher 1132 may be fabricated with a stepped mating surface having a first mating surface 1152 and a second mating surface 1154. The stepped mating surface may be configured to couple with the slot antenna. The EM wave launcher 1132 may comprise an edge wall extension 1156 located near a periphery of the resonator plate 1150 and configured to couple with the process chamber wall. Furthermore, the EM wave launcher 1132 may comprise an opening 1058 and a gas passage 1159. The opening 1058 may be configured to receive fastening devices for securing a gas line through the inner conductor of the EM wave launcher 1132 to the gas passage 1159 in resonator plate 1150. Although only one gas passage is shown, additional gas passages may be fabricated in the resonator plate 1150. Moreover, although the shape of the gas passage is straight having a cylindrical cross-section, it may be arbitrary, e.g., helical having an arbitrary cross-section. Any one or more of these features described in FIGS. 13A and 13B may be implemented in any one of the embodiments described in FIGS. 3 through 12B.

Using the design criteria set forth in the embodiments described in FIGS. 3 through 13, these embodiments and combinations thereof may be designed to produce stable, uniform plasma for a process window extending from pressures of 2 mtorr to 1 torr and powers up to 5 kW (e.g., 0.5 kW to 5 kW). The electron temperature achieved at the substrate plane may be about 1 eV. The relatively smaller recesses may discharge more readily at relatively high pressure, while the relatively larger recesses may discharge more readily at relatively low pressure. Additionally, the relatively smaller recesses may absorb excess power when the relatively larger recesses saturate. In these configurations, the plasma discharge may stabilize while natural EM modes may lock and/or break up. Thus, a stable discharge may be observed near the EM wave launcher and uniform plasma properties may be observed near the substrate plane within the above identified process window.

Although not shown in any one of the embodiments provided in FIGS. 3 through 13, one or more recesses in a recess configuration may be interconnected. Additionally, one or more recesses of one recess configuration may be interconnected with one or more recesses of another recess configuration. For example, one or more recesses may be interconnected or linked by a groove or channel.

Figure 14A:
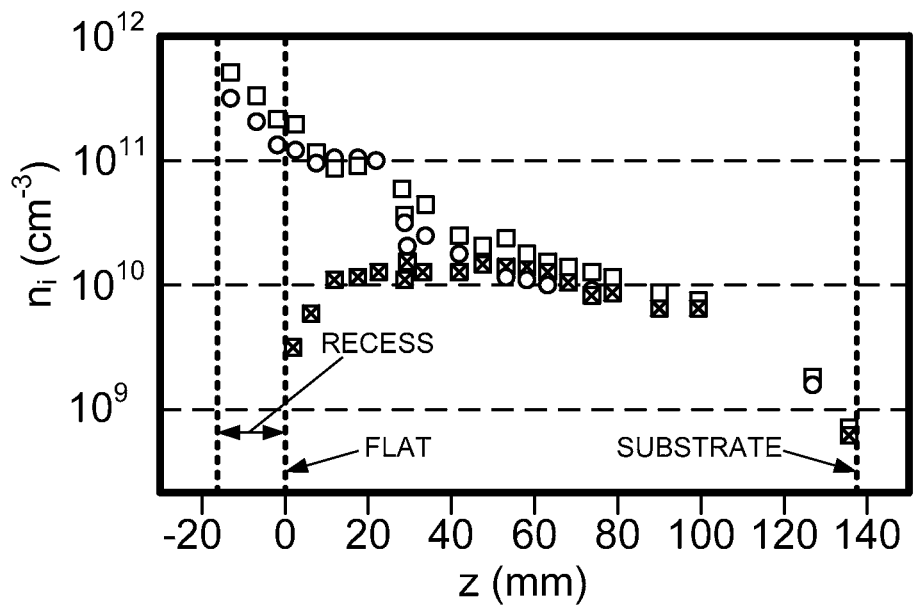
FIGS. 14A and 14B provide exemplary data for a SWP source.
Figure 14B:
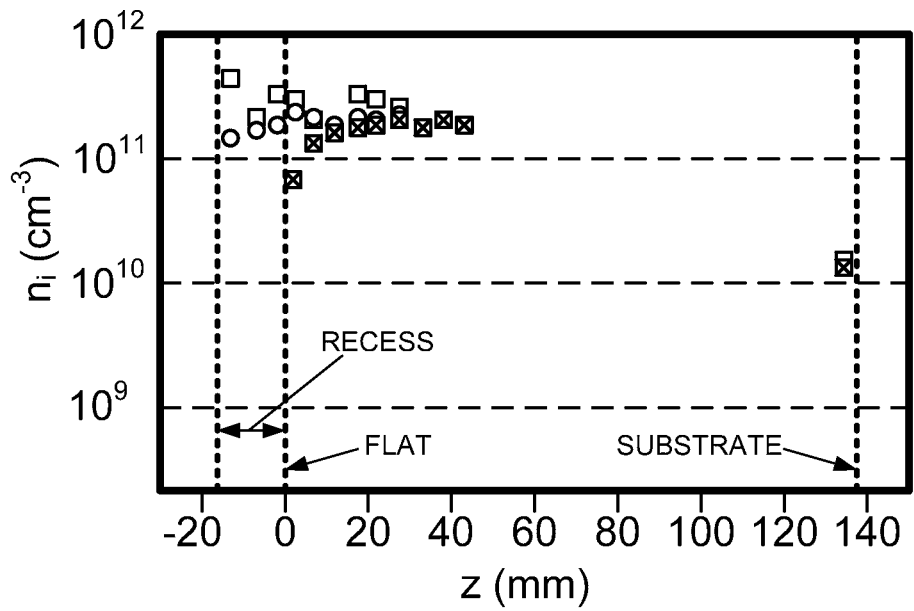

Referring now to FIGS. 14A and 14B, exemplary data for a SWP source is provided. The SWP source comprises an EM wave launcher having a plasma surface composed of a planar surface with a first recess configuration, a second recess configuration, and a third recess configuration. The first recess configuration comprises a plurality of cylindrical recesses located near an outer region of the plasma surface. The second recess configuration comprises a plurality of cylindrical recesses located near a mid-radius region of the plasma surface. The third recess configuration comprises a plurality of cylindrical recesses located near an inner region of the plasma surface.

The first recess configuration is substantially aligned with a first plurality of slots, the second recess configuration is partly aligned with a second plurality of slots, and the third recess configuration is not aligned with the first plurality of slots or the second plurality of slots. The first plurality of slots and the second plurality of slots may be arranged in pairs, wherein each of the pair of slots comprises a first slot oriented orthogonal to a second slot.

As shown in FIGS. 14A and 14B, plasma ion density ($n_i$, $cm^{-3}$) was measured for three regions as a function of location (z, in mm (millimeters)) across a plasma space extending from the planar surface (labeled as "FLAT" at z=0 mm) to a substrate (labeled as "SUBSTRATE" at z=130 mm). For locations where recess was present, the measurements extend to approximately z=−15 mm (labeled as "RECESS"). A first set of data (open squares) was acquired in a first region that extends from within a recess of the second recess configuration (e.g., partly aligned with a slot in the slot antenna) to the substrate. A second set of data (open circles) was acquired in a second region that extends from within a recess of the third recess configuration (e.g., not aligned with a slot in the slot antenna) to the substrate. A third set of data (crossed squares) was acquired in a third region that extends from the planar surface to the substrate. The measurement of plasma ion density was achieved using a Langmuir probe.

In FIG. 14A, the three sets of data were acquired for a pressure of 500 mtorr (millitorr), a power of 2000 W (Watts), and a flow rate of 700 sccm (standard cubic centimeters per minute). In FIG. 14B, the three sets of data were acquired for a pressure of 40 mtorr (millitorr), a power of 2000 W (Watts), and a flow rate of 700 sccm (standard centimeters per minute). At 500 mtorr (FIG. 14A), the plasma ion density increased as the probe extended into the respective recess for both the second recess configuration and the third recess configuration. At 40 mtorr (FIG. 14B), the ion density increased as the probe extended into the recesses of the second recess configuration and decreased as the probe extended into the recesses of the third recess configuration.

The recesses of the first recess configuration exhibit a relatively "full bright" glow across a range of power and a range of pressure (i.e., 40 mTorr to 500 mTorr). The recesses of the second recess configuration exhibit a relatively "bright" glow across a range of power and a range of pressure (i.e., 40 mTorr to 500 mTorr). The recesses of the third recess configuration exhibit a variation from a relatively "dim" glow to a "bright" glow depending on the power and pressure (i.e., 40 mTorr to 500 mTorr). In the latter, the plasma ion density (and plasma "brightness") increases with increasing pressure, and stabilizes the "full bright" glow associated with the first recess configuration. To the contrary, the "FLAT" regions of the planar surface remain relatively "dark", and the plasma ion density increases as the measurement extends into the plasma space. The three sets of data merge at about 30 to 50 mm into the plasma space, and then decay uniformly to the substrate.

Measurements and simulations (not shown) for each of the three regions have been performed to determine the variation of the electron temperature ($T_e$) and the electron energy probability distribution function (EEPf) as a function of position across the plasma space extending from the plasma surface to the substrate. The EEPf of the plasma spatially evolves from plasma characterized by an electron beam component and a single Maxwellian component in the plasma generation zone adjacent the plasma surface, to plasma characterized by an electron beam component and a bi-Maxwellian component, to plasma characterized by a bi-Maxwellian component, to a single Maxwellian component adjacent the substrate. For all three regions, the plasma evolves to a quiescent plasma having a single Maxwellian component characterized by a low electron temperature.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A surface wave plasma (SWP) source, comprising:
an electromagnetic (EM) wave launcher configured to couple EM energy in a desired EM wave mode to a plasma by generating a surface wave on a plasma surface of said EM wave launcher adjacent said plasma, said EM wave launcher comprises a slot antenna having a plurality of slots formed therethrough configured to couple said EM energy from a first region above said slot antenna to a second region below said slot antenna;
a resonator plate positioned in said second region and having a lower surface of said resonator plate including said plasma surface of the EM wave launcher, wherein said resonator plate comprises a dielectric plate having a plate diameter and a plate thickness;
a first recess configuration formed in said plasma surface, said first recess configuration substantially aligned with a first arrangement of slots in said plurality of slots, wherein said first recess configuration comprises:
a first plurality of cylindrical recesses, each of said first plurality of cylindrical recesses being characterized by a first depth and a first diameter or,
a first annular shelf, said first annular shelf being characterized by a first shelf depth and first shelf width, or
a first annular channel, said first annular channel being characterized by a first channel depth, a first inner channel radius, and a first outer channel radius, or
a combination of two or more thereof;
a second recess configuration formed in said plasma surface, said second recess configuration either partly aligned with a second arrangement of slots in said plurality of slots or not aligned with said second arrangement of slots in said plurality of slots, wherein said second recess configuration comprises:
a second plurality of cylindrical recesses, each of said second plurality of cylindrical recesses being characterized by a second depth and a second diameter, or
a second annular shelf, said second annular shelf being characterized by a second shelf depth and a second shelf width, or
a second annular channel, said second annular channel being characterized by a second channel depth, a second inner channel radius, and a second outer channel radius, or
a combination of two or more thereof; and
a power coupling system coupled to said EM wave launcher and configured to provide said EM energy to said EM wave launcher for forming said plasma, wherein said EM energy comprises an effective wavelength ($\lambda$) of propagation in said resonator plate, and wherein:
said first diameter is about half said effective wavelength ($\lambda/2$),
said second diameter is about half said effective wavelength ($\lambda/2$) or about quarter said effective wavelength ($\lambda/4$),
a first difference between said plate thickness and said first depth, said first shelf depth or said first channel depth is about half said effective wavelength ($\lambda/2$) or about quarter said effective wavelength ($\lambda/4$), and a second difference between said plate thickness and said second depth, said second shelf depth, or said second channel depth is about half said effective wavelength (λ/2) or about quarter said effective wavelength (λ/4).

2. The SWP source of claim 1, wherein:
said power coupling system comprises a coaxial feed for coupling EM energy to said EM wave launcher, and
said slot antenna comprises one end coupled to an inner conductor of said coaxial feed and another end coupled to an outer conductor of said coaxial feed.

3. The SWP source of claim 1, wherein said EM wave launcher further comprises:
a slow wave plate positioned in said first region and configured to reduce an effective wavelength of said EM energy relative to a wavelength of said EM energy in free space.

4. The SWP source of claim 3, wherein said slow wave plate and said resonator plate each consist essentially of quartz or a high dielectric constant (high-k) material, said high dielectric constant material having a dielectric constant greater than a value of 4.

5. The SWP source of claim 1, wherein said power coupling system comprises:
a microwave source configured to produce microwave energy at 2.45 GHz;
a waveguide coupled to an outlet of said microwave source;
an isolator coupled to said waveguide and configured to prevent propagation of microwave energy back to said microwave source; and
a coaxial converter coupled to said isolator and configured to couple said microwave energy to a coaxial feed, wherein said coaxial feed is further coupled to said EM wave launcher.

6. The SWP source of claim 1, wherein said plurality of slots are arranged in pairs, and wherein each of said pair of slots comprises a first slot oriented orthogonal to a second slot.

7. The SWP source of claim 1, wherein said first recess configuration is located near an outer region of said plasma surface.

8. The SWP source of claim 1, wherein said second recess configuration is located near an inner region of said plasma surface.

9. The SWP source of claim 1, wherein said plate thickness is about half said effective wavelength (λ/2).

10. The SWP source of claim 1, further comprising:
a third plurality of cylindrical recesses formed at a bottom of said first annular shelf or at a bottom of said first annular channel, each of said third plurality of cylindrical recesses being characterized by a third depth and a third diameter.

11. The SWP source of claim 10, wherein a third difference between said plate thickness and said third depth is about quarter said effective wavelength (λ/4).

12. A surface wave plasma (SWP) source, comprising:
an electromagnetic (EM) wave launcher configured to couple EM energy in a desired EM wave mode to a plasma by generating a surface wave on a plasma surface of said EM wave launcher adjacent said plasma, said EM wave launcher comprises a slot antenna having a plurality of slots formed therethrough configured to couple said EM energy from a first region above said slot antenna to a second region below said slot antenna;
a resonator plate positioned in said second region and having a lower surface of said resonator plate including said plasma surface of the EM wave launcher, wherein said resonator plate comprises a dielectric plate having a plate diameter and a plate thickness;
a first recess configuration formed in said plasma surface, said first recess configuration substantially aligned with a first arrangement of slots in said plurality of slots, wherein said first recess comprises:
a first plurality of cylindrical recesses, each of said plurality of cylindrical recesses being characterized by a first depth and a first diameter or,
a first annular shelf, said first annular shelf being characterized by a first shelf depth and first shelf width, or
a first annular channel, said first annular channel being characterized by a first channel depth, a first inner channel radius, and a first outer channel radius, or
a combination of two or more thereof;
a second recess configuration formed in said plasma surface, said second recess configuration either partly aligned with a second arrangement of slots in said plurality of slots or not aligned with said second arrangement of slots in said plurality of slots, wherein said second recess configuration comprises:
a second plurality of cylindrical recesses, each of said second plurality of cylindrical recesses being characterized by a second depth and a second diameter, or
a second annular shelf, said second annular shelf being characterized by a second shelf depth and a second shelf width, or
a second annular channel, said second annular channel being characterized by a second channel depth, a second inner channel radius, and a second outer channel radius, or
a combination of two or more thereof; and
a power coupling system coupled to said EM wave launcher and configured to provide said EM energy to said EM wave launcher for forming said plasma, wherein:
said plate thickness ranges from about 25 mm to about 45 mm,
said first diameter ranges from about 25 mm to about 35 mm,
said second diameter ranges from about 25 mm to about 35 mm,
a first difference between said plate thickness and said first depth, said first shelf depth, or said first channel depth ranges from about 10 mm to about 35 mm, and
a second difference between said plate thickness and said second depth, said second shelf depth, or said second channel depth ranges from about 10 mm to about 35 mm.

13. The SWP source of claim 12, wherein said second diameter is less than said first diameter.

14. The SWP source of claim 12, wherein:
said power coupling system comprises a coaxial feed for coupling EM energy to said EM wave launcher, and
said slot antenna comprises one end coupled to an inner conductor of said coaxial feed and another end coupled to an outer conductor of said coaxial feed.

15. The SWP source of claim 12, wherein said EM wave launcher further comprises:
a slow wave plate positioned in said first region and configured to reduce an effective wavelength of said EM energy relative to a wavelength of said EM energy in free space.

16. The SWP source of claim 12, wherein said power coupling system comprises:
a microwave source configured to produce microwave energy at 2.45 GHz;

a waveguide coupled to an outlet of said microwave source;
an isolator coupled to said waveguide and configured to prevent propagation of microwave energy back to said microwave source; and
a coaxial converter coupled to said isolator and configured to couple said microwave energy to a coaxial feed, wherein said coaxial feed is further coupled to said EM wave launcher.

17. The SWP source of claim 12, wherein said plurality of slots are arranged in pairs, and wherein each of said pair of slots comprises a first slot oriented orthogonal to a second slot.

18. The SWP source of claim 12, further comprising:
a third plurality of cylindrical recesses formed at a bottom of said first annular shelf or at a bottom of said first annular channel, each of said third plurality of cylindrical recesses being characterized by a third depth and a third diameter.

19. A surface wave plasma (SWP) source, comprising:
an electromagnetic (EM) wave launcher configured to couple EM energy in a desired EM wave mode to a plasma by generating a surface wave on a plasma surface of said EM wave launcher adjacent said plasma, said EM wave launcher comprises a slot antenna having a plurality of slots formed therethrough configured to couple said EM energy from a first region above said slot antenna to a second region below said slot antenna;
a resonator plate positioned in said second region and having a lower surface of said resonator plate including said plasma surface of the EM wave launcher, wherein said resonator plate comprises a dielectric plate having a plate diameter and a plate thickness;
a first recess configuration formed in said plasma surface, said first recess configuration substantially aligned with a first arrangement of slots in said plurality of slots, wherein said first recess comprises:
a first plurality of cylindrical recesses, each of said plurality of cylindrical recesses being characterized by a first depth and a first diameter or,
a first annular shelf, said first annular shelf being characterized by a first shelf depth and first shelf width, or
a first annular channel, said first annular channel being characterized by a first channel depth, a first inner channel radius, and a first outer channel radius, or
a combination of two or more thereof;
a second recess configuration formed in said plasma surface, said second recess configuration either partly aligned with a second arrangement of slots in said plurality of slots or not aligned with said second arrangement of slots in said plurality of slots, wherein said second recess configuration comprises
a second plurality of cylindrical recesses, each of said second plurality of cylindrical recesses being characterized by a second depth and a second diameter, or
a second annular shelf, said second annular shelf being characterized by a second shelf depth and a second shelf width, or
a second annular channel, said second annular channel being characterized by a second channel depth, a second inner channel radius, and a second outer channel radius, or
a combination of two or more thereof;
a power coupling system coupled to said EM wave launcher and configured to provide said EM energy to said EM wave launcher for forming said plasma; and
a third recess configuration formed in said plasma surface, said third recess configuration not aligned with any of said plurality of slots, each of said third plurality of cylindrical recesses being characterized by a third depth and a third diameter.

20. A surface wave plasma (SWP) source, comprising:
an electromagnetic (EM) wave launcher configured to couple EM energy in a desired EM wave mode to a plasma in a process space by generating a surface wave on a plasma surface of said EM wave launcher adjacent said plasma, said EM wave launcher comprises a slot antenna having a plurality of slots formed therethrough configured to couple said EM energy from a first region above said slot antenna to a second region below said slot antenna, and a resonator plate positioned in said second region and having a lower surface of said resonator plate including said plasma surface of the EM wave launcher;
a first recess configuration formed in said plasma surface, said first recess configuration substantially aligned with a first arrangement of slots in said plurality of slots;
means for stabilizing said plasma for a pressure in said process space ranging from about 2 mtorr to about 1 torr, said means for stabilizing said plasma being formed in said plasma surface of said resonator plate;
means for uniformly generating said plasma in said process space; and
a power coupling system coupled to said EM wave launcher and configured to provide said EM energy to said EM wave launcher for forming said plasma.

* * * * *